(12) United States Patent
Yang

(10) Patent No.: US 10,636,503 B2
(45) Date of Patent: Apr. 28, 2020

(54) ALTERATION OF SENSING TIME IN MEMORY CELLS

(71) Applicant: SanDisk Technologies LLC, Addison, TX (US)

(72) Inventor: Xiang Yang, Santa Clara, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/145,012

(22) Filed: Sep. 27, 2018

(65) Prior Publication Data

US 2020/0066363 A1 Feb. 27, 2020

Related U.S. Application Data

(60) Provisional application No. 62/720,317, filed on Aug. 21, 2018.

(51) Int. Cl.
| | |
|---|---|
| *G11C 16/34* | (2006.01) |
| *G11C 16/10* | (2006.01) |
| *G11C 16/32* | (2006.01) |
| *G11C 16/04* | (2006.01) |
| *G11C 11/56* | (2006.01) |

(52) U.S. Cl.
CPC ...... *G11C 16/3454* (2013.01); *G11C 16/0483* (2013.01); *G11C 16/10* (2013.01); *G11C 16/32* (2013.01); *G11C 11/5628* (2013.01); *G11C 11/5671* (2013.01); *G11C 2211/5621* (2013.01)

(58) Field of Classification Search
CPC .................................................. G11C 11/5628
USPC .................................................. 365/185.22
See application file for complete search history.

(56) References Cited

U.S. PATENT DOCUMENTS

| | | | | |
|---|---|---|---|---|
| 7,046,555 | B2 | 5/2006 | Lutze | |
| 2013/0077408 | A1* | 3/2013 | Ueno | G11C 16/06 365/185.22 |
| 2014/0136765 | A1* | 5/2014 | Oh | G11C 16/0483 711/103 |
| 2015/0276850 | A1* | 10/2015 | Lu | G01R 31/2621 702/65 |
| 2015/0340099 | A1* | 11/2015 | Kwak | G11C 16/34 711/103 |
| 2016/0035417 | A1* | 2/2016 | Park | G11C 13/004 365/148 |
| 2017/0110185 | A1* | 4/2017 | Hahn | G11C 11/5628 |
| 2017/0206978 | A1 | 7/2017 | Joo | |
| 2019/0096479 | A1* | 3/2019 | Yu | G11C 11/5642 |

FOREIGN PATENT DOCUMENTS

WO 2012044635 4/2012

* cited by examiner

*Primary Examiner* — Min Huang
(74) *Attorney, Agent, or Firm* — Vierra Magen Marcus LLP

(57) ABSTRACT

An apparatus includes a programming circuit configured to deliver a series of program loops to a memory cell. The apparatus further includes a sensing circuit configured to sense an electrical characteristic of the memory cell for a sensing time during each program loop. The apparatus also includes an alteration circuit configured to alter the sensing time of a subsequent program loop in response to a programming condition.

18 Claims, 16 Drawing Sheets

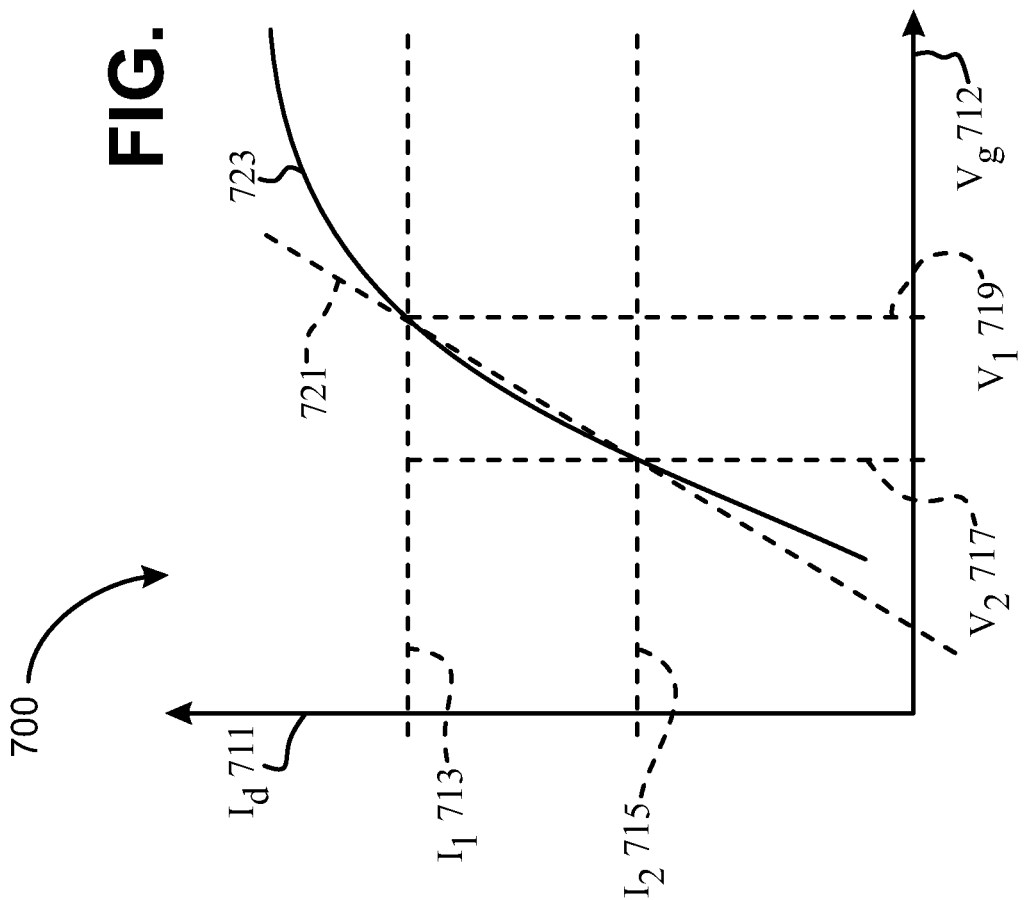

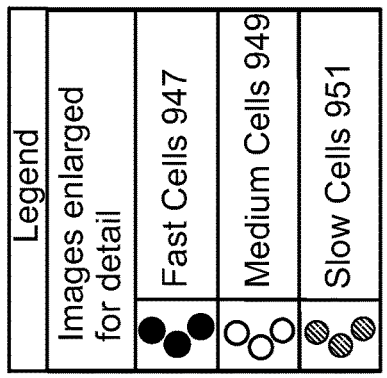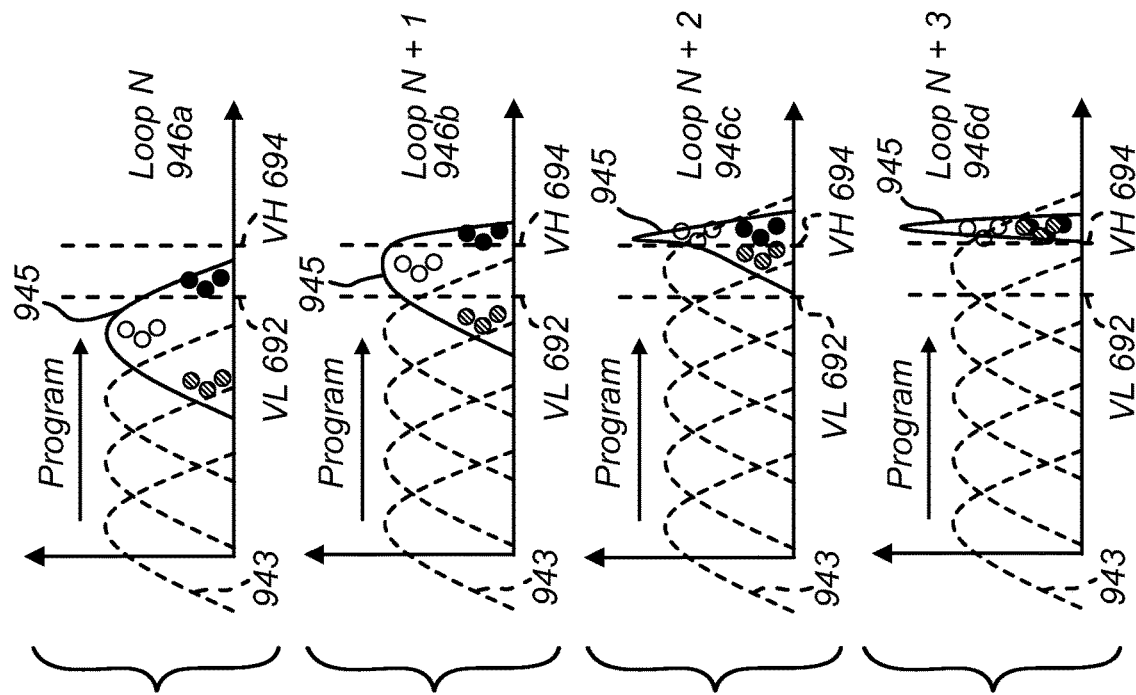
FIG. 9A  FIG. 9B  FIG. 9C  FIG. 9D

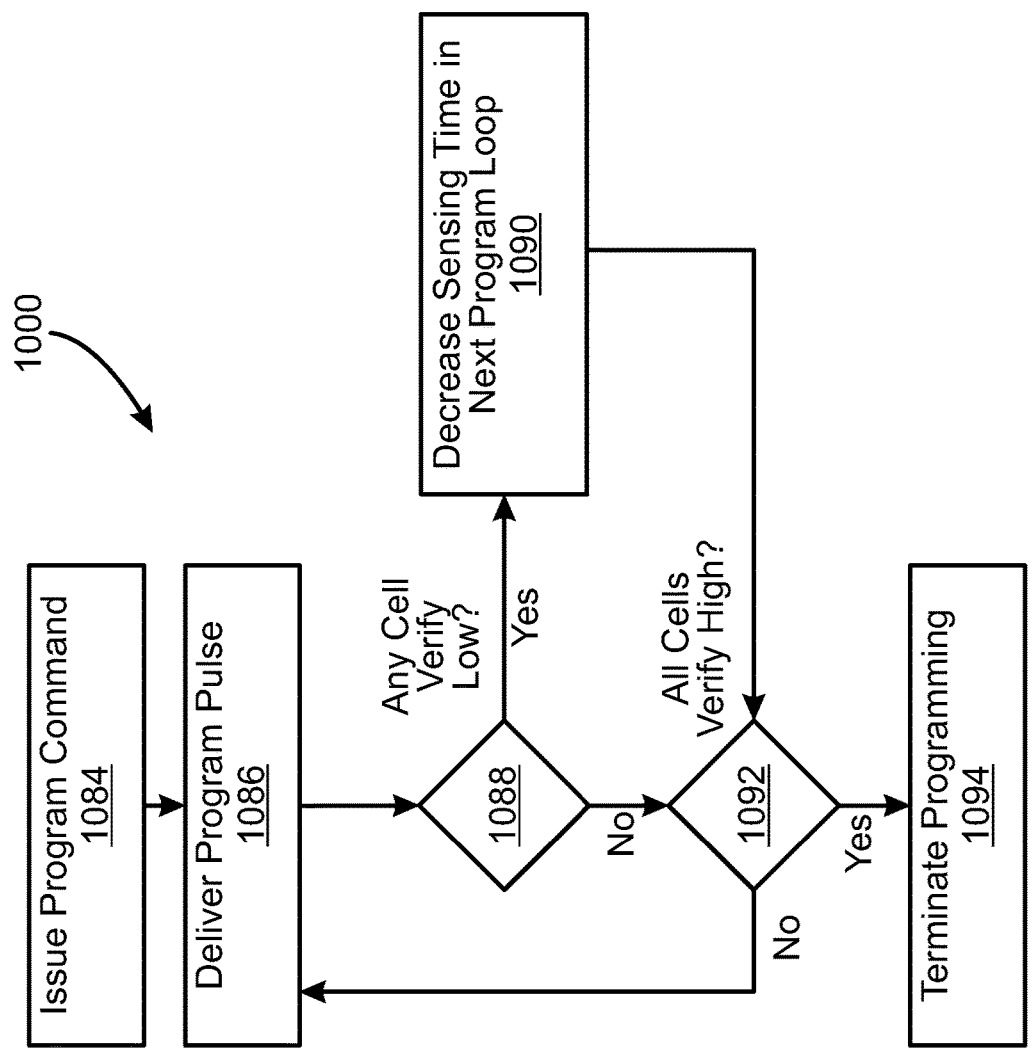

FIG. 11D Step #4: A delta (Δ) is calculated by subtracting the voltage level of first verification level from the voltage level the second verification level

FIG. 11E Step #5: Subthreshold slope is calculated using the delta and the first and the second sensing time

FIG. 11F Step #6: Adjust sensing time based on a mapping table

ALTERATION OF SENSING TIME IN MEMORY CELLS

FIELD OF THE DISCLOSURE

This application claims priority to and is a non-provisional application of U.S. App. No. 62/720,317, which is incorporated herein in its entirety by this reference.

FIELD OF THE DISCLOSURE

This disclosure is generally related to data storage devices and more particularly to the alteration of sensing time in a memory cell.

BACKGROUND

Non-volatile data storage devices, such as flash solid state memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 2 bits per cell, 3 bits per cell, 4 bits per cell, or more.

Although increasing the number of bits per cell and reducing device feature dimensions may increase a storage density of a memory device, a bit error rate (BER) for data stored in the memory device may also increase. For example, if data states are not maintained with high accuracy, increased errors may occur.

BRIEF DESCRIPTION OF THE DRAWINGS

FIG. 7 comprises an I-V curve illustrating one embodiment of subthreshold slope.

FIGS. 9A-D are charts illustrating embodiments of distribution curves of threshold values showing programming a set of memory cells having fast, medium and slow cells utilizing varied sensing times.

FIG. 10 is a flow diagram illustrating one embodiment of a method for altering sensing time when a verification level is reached.

FIGS. 11A-F illustrate one embodiment of steps for calculating subthreshold slope and setting a default sensing time based on the calculated subthreshold slope.

DETAILED DESCRIPTION

Figure 1:
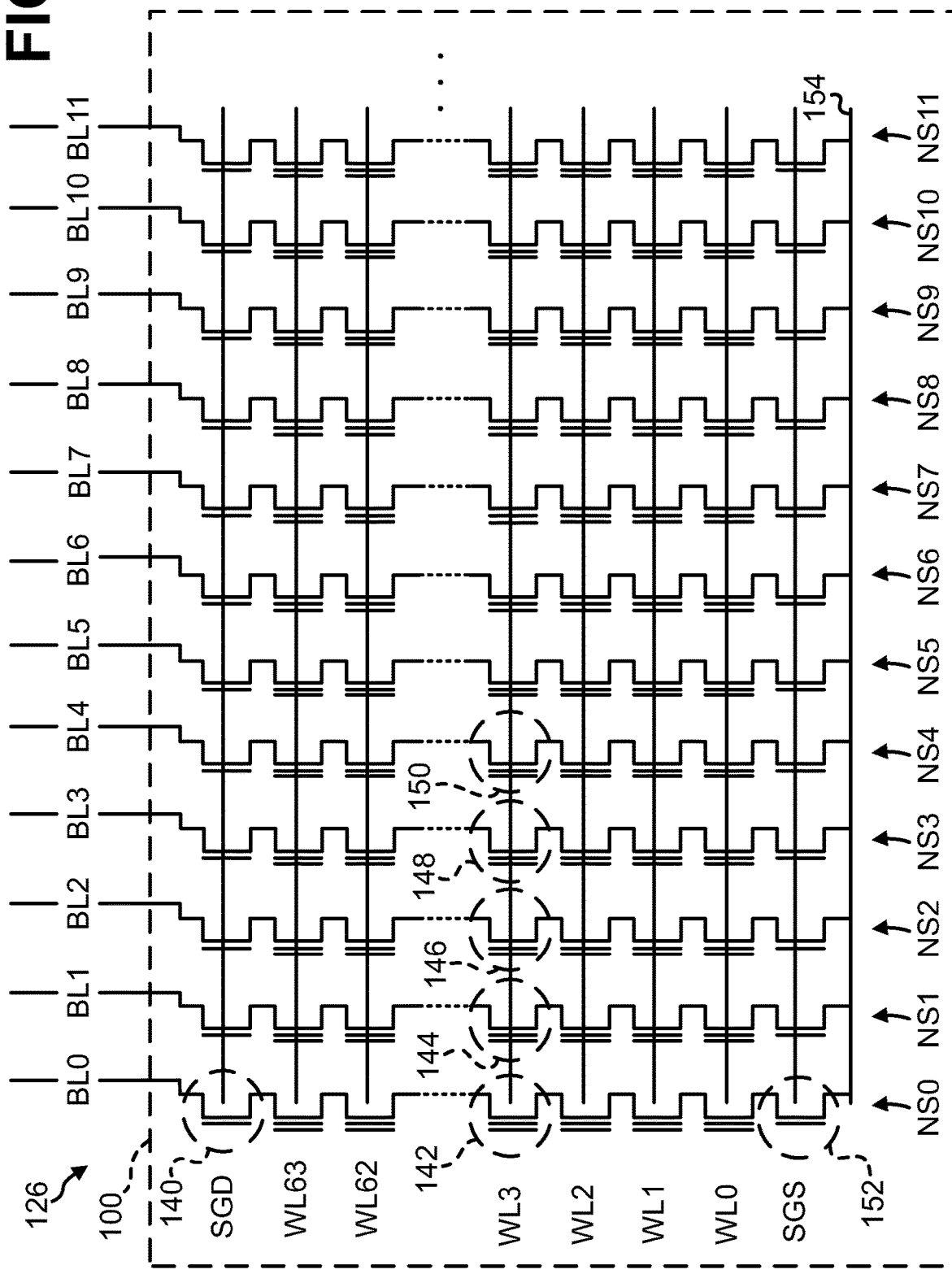
FIG. 1 depicts one embodiment of an array of memory cells including bit and word lines.

Particular examples in accordance with the disclosure are described below with reference to the drawings. It should be noted that multiple similar elements may be labeled with a number and a letter (e.g., loops 946a-d). When an element is referred to by the number without a letter, this may generally refer to any one of the illustrated elements with the number, to some of the illustrated elements with the number, to all of the illustrated elements with the number, or to another similar element. For example, a "loop 946" may generally refer to one or more of the loops 946a, 946b, 946c, 946d illustrated in the figures. When an element is referred to without a number, this may refer to the element in general without limitation to any specific embodiment. Also, in order to avoid the undue proliferation of reference numerals and lead lines on a particular figure in which multiple instances of the same item appear, in general, only one such item will be labeled with a reference numeral and lead line.

By way of introduction, the following brief definitions are provided of various terms used in this application. Additional definitions will be provided in the context of the discussion of the figures.

As used herein, "exemplary" may indicate an example, an implementation, and/or an aspect, and should not be construed as limiting or as indicating a preference or a preferred implementation. Further, it is to be appreciated that certain ordinal terms (e.g., "first" or "second") may be provided for identification and ease of reference and may not necessarily imply physical characteristics or ordering. Therefore, as used herein, an ordinal term (e.g., "first," "second," "third") used to modify an element, such as a structure, a component, an operation, etc., does not necessarily indicate priority or order of the element with respect to another element, but rather distinguishes the element from another element having the same name (but for use of the ordinal term). In addition, as used herein, indefinite articles ("a" and "an") may indicate "one or more" rather than "one." As used herein, a structure or operation that "comprises" or "includes" an element may include one or more other elements not explicitly recited. Further, an operation performed "based on" a condition or event may also be performed based on one or more other conditions or events not explicitly recited. As used in this application, the terms "an embodiment," "one embodiment," "another embodiment," or analogous language do not refer to a single variation of the disclosed subject matter; instead, this language refers to variations of the disclosed subject matter that may be applied and used with a number of different implementations of the disclosed subject matter.

As used herein, a "programming circuit" refers to a circuit utilized to execute or deliver one or more program loops. A "program loop" comprises a period of time encompassing a programming pulse and extends until another programming pulse is issued or the particular programming procedure comes to an end. A program loop encompasses a programming pulse followed by one or more verification pulses.

An "activation response value" comprises a value representing how a memory cell responds to a control signal, such as a voltage level applied to a control gate of the memory cell. Because of manufacturing variation, memory cells often respond differently to the application of the same voltage level to the control gate. The activation response value may be calculated using subthreshold slope. A "rate at which one or more cells respond to a sensing signal" is a rate representing how a memory cell responds to a "sensing signal." A "sensing signal" is a signal applied, for example, to a control gate of a memory cell for the purpose of determining a threshold voltage level stored in a memory cell. This rate may be measured using subthreshold slope.

The term "subthreshold slope" is a computed value that represents a slope of a portion of an I-V curve, which is illustrated in FIG. 7. The threshold slope may be computed, using, for example, Equation 2 or Equation 3.

A "distribution curve of threshold values" refers to a graph illustrating variation among threshold values stored in memory cells. This type of graph is often presented in the shape of a bell curve.

A "verification" comprises a procedure to determine whether a particular characteristic has been satisfied in a memory cell, such as determining that a particular threshold voltage level has been stored in a memory cell. A "low verification level" verifies the characteristic at a lower level than a "high verification level." As used in this application, a "range" refers to a difference between a low verification level and a high verification level.

The terms "threshold voltage level" or "threshold voltage" refer to a voltage level stored in a memory cell.

A "sensing circuit" is a circuit utilized to sense a value stored in a memory cell, such as a threshold voltage level. A sensing circuit may comprise one or more sensing blocks coupled to a particular word or set of word lines. Often, a series of electrical pulses applied to a control gate are utilized to verify a threshold voltage level.

An "alteration circuit" is a circuit that alters a sensing time used to verify an electrical characteristic of a memory cell (e.g., a threshold voltage in a flash configuration or a resistive state in a resistive memory configuration).

A "programming condition" comprises a condition related to programming, such as a particular threshold voltage level being satisfied, a number of program loops being completed or calculation of an activation response value (e.g., a level of subthreshold slope or a rate at which a set of one or more cells respond to a sensing signal) for a memory cell or a set of memory cells.

An "electrical characteristic" refers to a characteristic of a memory cell, such as a threshold voltage level stored in a memory cell.

A "trigger threshold" comprises a specified level or range, generally established in advance, which when satisfied results in a particular action or event, such as altering a sensing time. By way of example, a trigger threshold may comprise a trigger threshold voltage. In one embodiment, a trigger threshold is satisfied when a threshold voltage of a memory cell is at the same level as the trigger threshold or exceeds the trigger threshold. A trigger threshold voltage may comprise a trigger threshold voltage level or a trigger threshold voltage range. In such an embodiment, a trigger threshold is satisfied when a threshold voltage of a memory cell is within the trigger threshold voltage range. A trigger threshold voltage range comprises, in one embodiment, a range between a low verification level and a high verification level. In one embodiment, a low verification level comprises a level at which programming of memory cells is slowed down (i.e., programming steps are decreased in magnitude such that the threshold voltage of the memory cells changes less with each programming loop) and a high verification level comprises a level at which programming ceases, such as in connection with a quick pass write procedure. In another example, a trigger threshold may comprise a resistance level or range of resistance levels for current passing through, or near, a memory cell. Such a trigger threshold may be used in embodiments in which the memory cells comprises a Magnetoresistance Random Access Memory (MRAM) cell or Phase Change Memory (PCM) memory cell.

A "sensing time" comprises a period of time during which sensing of an electrical characteristic of a memory cell occurs. The "sensing time" may be varied to alter detected levels for the memory cell.

A "sensing time modifier" is a modifier utilized to alter the sensing time. For example, a modifier may comprise 0.5 µs, which may be subtracted from another sensing time or a previously used sensing time.

A "default sensing time" refers to a sensing time used in a standard program loop. In one embodiment, program loops prior to satisfaction of a particular verification level use the default sensing time, while loops after the verification level has been satisfied use a non-default or altered sensing time.

As used herein, the term "memory" denotes semiconductor memory. Types of semiconductor memory include non-volatile memory and volatile memory. Non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM or PCM). Non-volatile memory includes one or more memory cells.

A "memory cell" is an electronic device or component capable of storing electronic information. In an embodiment, non-volatile memory utilizes floating-gate transistors or charge trap transistors as memory cells. The ability to adjust the threshold voltage of a floating-gate transistor or charge trap transistor allows the transistor to act as a non-volatile storage element or memory cell. In some cases, more than one data bit per memory cell (i.e., a multi-level or multi-state memory cell) may be provided by programming and reading multiple threshold voltages or threshold voltage ranges. A "memory die" comprises a block of semiconducting material on which a memory circuit is fabricated and, as used herein, also includes the memory circuit disposed thereon.

As noted above, additional definitions of the foregoing terms will be provided below in the context of the figures.

Apparatus and methods for altering sensing time are disclosed herein. During programming of memory cells, verification of various levels of values stored in the memory cells may be performed to verify or determine which value is stored in a cell(s). Altering the verification level (i.e., the level to be verified) may be achieved in at least two different ways: by altering the voltage level applied to the control gate or by altering the sensing time of the level to be verified. The following application discloses, for example, altering the sensing time based on how quickly memory cells satisfy a particular verification level. In addition, sensing time may also be altered based on an activation response value. The activation response value may be calculated, for example, using subthreshold slope.

FIG. 1 depicts a block of NAND flash memory cells in a memory array 126. The memory array 126 can include many blocks. An illustrative block 100 includes a number of NAND strings NS0 to NS11 and respective bit lines, e.g., BL0 to BL11, which are shared among the blocks. Each NAND string is connected at one end to a drain select gate (SGD), and the control gates of the drain select gates are connected via a common SGD line. Each NAND string is connected at its other end to a source select gate which, in turn, is connected to a common source line 154. For example, NS0 includes a source side select gate transistor 152 and a drain side select gate transistor 140. Example storage elements 142, 144, 146, 148, and 150 are in NS0 to NS4, respectively, and are connected to a word line WL3. For example, WL3 could be a selected word line which is selected for programming and the example storage elements can be selected storage elements which are selected for programming. Other storage elements connected to WL3 can also be selected storage elements. Sixty-four word lines, for example, WL0-WL63, extend between the source-side select gates and the drain-side select gates.

Other types of non-volatile memory in addition to NAND flash memory can also be used. For example, another type of memory cell useful in flash EEPROM systems utilizes a nonconductive dielectric material in place of a conductive floating gate to store charge in a non-volatile manner. In an embodiment, triple layer dielectric formed of silicon oxide, silicon nitride, and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the voltage level of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor. Another type of memory uses a metallic (conductive) charge storage element in a NAND architecture.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is obtained by separately reading binary states of the spatially separated charge storage regions within the dielectric. Other types of non-volatile memory are also known. In an alternative embodiment, resistance levels rather than voltage levels may be stored and sensed.

Figure 2:
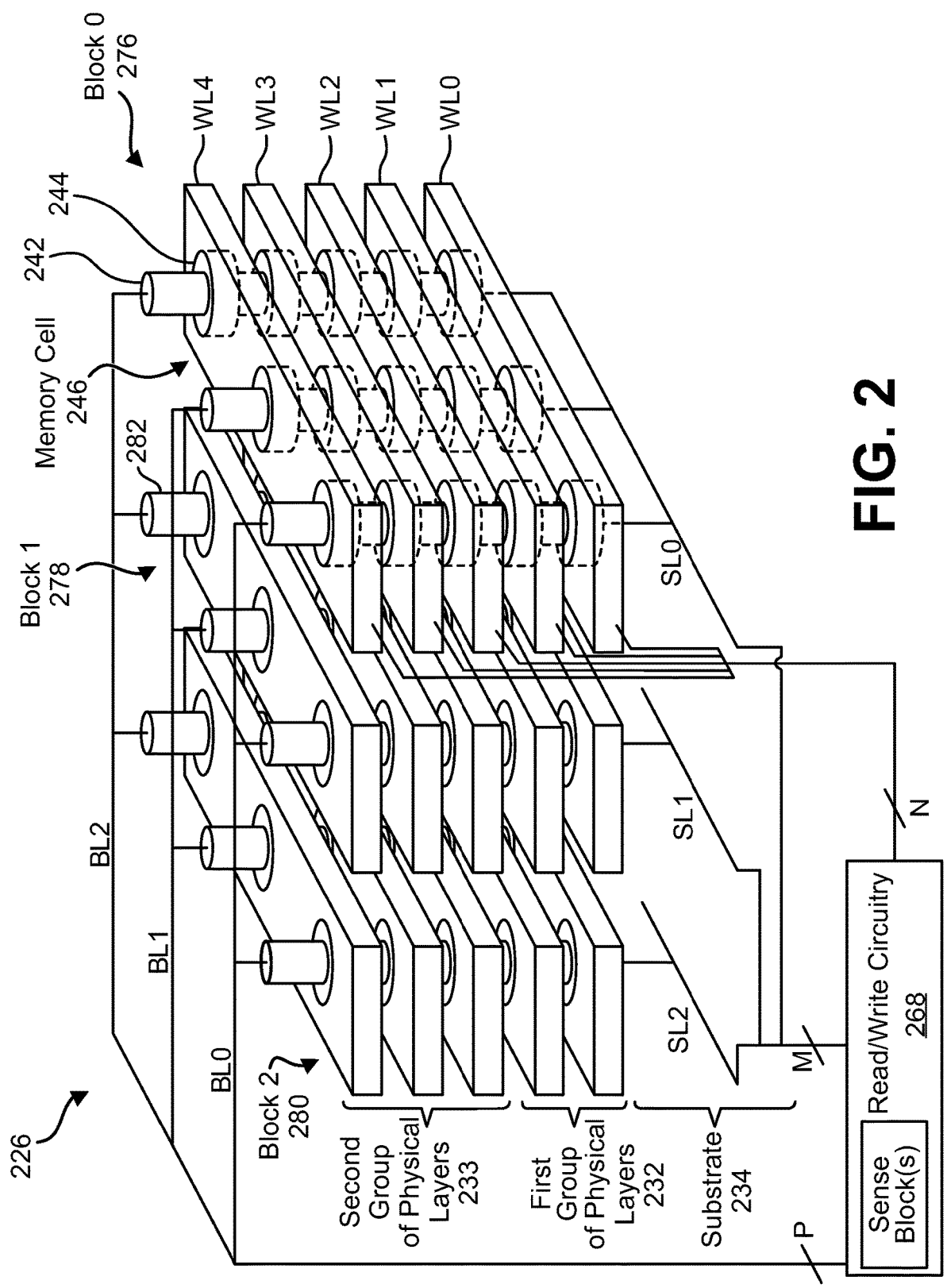
FIG. 2 is a diagram illustrating an embodiment of a 3D memory in a NAND configuration.

FIG. 2 illustrates an embodiment of 3D memory 226 in a NAND flash configuration. The 3D memory 226 includes multiple physical layers that are monolithically formed above a substrate 234, such as a silicon substrate. Storage elements (e.g., memory cells), such as a representative memory cell 246, are arranged in arrays in the physical layers.

The representative memory cell 246 includes a charge trap structure 244 between a word line/control gate WL4 and a conductive channel 242. Charge may be injected into or drained from the charge trap structure 244 via biasing of the conductive channel 242 relative to the word line WL4. For example, the charge trap structure 244 may include silicon nitride and may be separated from the word line WL4 and the conductive channel 242 by a gate dielectric, such as a silicon oxide. An amount of charge in the charge trap structure 244 affects an amount of current through the conductive channel 242 during a read operation of the memory cell 246 and indicates one or more bit values that are stored in the memory cell 246.

The 3D memory 226 includes multiple erase blocks, including a first block (block 0) 276, a second block (block 1) 278, and a third block (block 2) 280. Each block 276, 278, 280 includes a "vertical slice" of the physical layers that includes a stack of word lines, illustrated as a first word line WL0, a second word line WL1, a third word line WL2, a fourth word line WL3, and the fifth word line WL4. Multiple conductive channels (having a substantially vertical orientation with respect to FIG. 2) extend through the stack of word lines. Each conductive channel is coupled to a storage element in each word line WL0-WL4, forming a NAND string of storage elements. FIG. 2 illustrates three blocks 276, 278, 280, five word lines WL0-WL4 in each block 276, 278, 280, and three conductive channels in each block 276, 278, 280 for clarity of illustration. However, the 3D memory 226 may have more than three blocks, more than five word lines per block, and more than three conductive channels per block.

Read/write circuitry 268 is coupled to the conductive channels via multiple conductive lines, illustrated as a first bit line BL0, a second bit line BL1, and a third bit line BL2 at a first end of the conductive channels (e.g., an end most remote from the substrate 234) and a first source line SL0, a second source line SL1, and a third source line SL2 at a second end of the conductive channels (e.g., an end nearer to or within the substrate 234). The read/write circuitry 268 is illustrated as coupled to the bit lines BL0-BL2 via "P" control lines, coupled to the source lines SL0-SL2 via "M" control lines, and coupled to the word lines WL0-WL4 via "N" control lines. Each of P, M, and N may have a positive integer value based on the specific configuration of the 3D memory 226. In one example, P=3, M=3, and N=5.

In a particular embodiment, each of the bit lines BL0-BL2 and each of the source lines SL0-SL2 may be coupled to the same end (e.g., the first end or the second end) of different conductive channels. For example, a particular bit line BL0-BL2 may be coupled to a first end of a conductive channel 282 and a particular source line may be coupled to a first end of the conductive channel 242. A second end of the conductive channel 282 may be coupled (e.g., electrically coupled) to a second end of the conductive channel 242. Accordingly, the conductive channel 282 and the conductive channel 242 may be coupled in series and may be coupled to the particular bit line BL0-BL2 and the particular source line SL0-SL2, each of which is coupled to a particular NAND string.

Although each of the conductive channels, such as the conductive channels 242, 282, is illustrated as a single conductive channel, each of the conductive channels may include multiple conductive channels that are in a stack configuration. The multiple conductive channels in a stacked configuration may be coupled by one or more connectors. Additionally, an etch stop layer (not illustrated in FIG. 2) having a conductive connector coupled to physically proximate portions of a conductive channel may be included in the multiple conductive channels, such as between the first group of physical layers 232 and the second group of physical layers 233. Additionally or alternatively, one or more sub-block gate transistors (not illustrated in FIG. 2) may be coupled between the first group of physical layers 232 and the second group of physical layers 233.

In an embodiment, the first group of physical layers 232 is an example of a sub-block and the second group of physical layers 233 is an example of a second sub-block. For example, each sub-block (e.g., "word line-based" sub-blocks) may include memory cells corresponding to a subset of word lines WL0-WL4. In an alternative embodiment, each sub-block (e.g., "string-based" sub-blocks) may include memory cells corresponding to a subset of strings (e.g., NAND strings), and may have, for example, common source lines SL0-SL2, but not common bit lines BL0-BL2 or vice versa.

The read/write circuitry 268 facilitates and/or effectuates read and write operations performed on the 3D memory 226. For example, data may be stored to storage elements coupled to a word line WL0-WL4 and the read/write circuitry 268 may read bit values from the storage elements (e.g., memory cells) using one or more sense block(s) 236. As another example, the read/write circuitry 268 may apply selection signals to control lines coupled to the word lines WL0-WL4, the bit lines BL0-BL2, and the source lines SL0-SL2 to cause a programming voltage (e.g., a voltage pulse or series of voltage pulses) to be applied across selected storage element(s) of the selected word line (e.g., the fourth word line WL4).

The read/write circuitry 268 includes one or more sense blocks 236. The sense blocks 236 are utilized to read or sense one or more values stored in a memory cell. In one approach, one sense block 236 is provided for a group of NAND strings, each of which is coupled to a particular bit line BL0-BL2. For example, a sense block 236 is associated with BL0. Another sense block 236 is associated with BL1, and yet another sense block 236 is associated with BL2. Each sense block 236 may include a memory controller (not illustrated in FIG. 2). Each sense block 236 also includes a sense module for each NAND string. Alternatively, a sense block 236 may be coupled to some interval of bit lines, such as even or odd numbered bit lines. The sense block 236 will be discussed further in connection with FIG. 3.

During a read operation, a controller may receive a request from a host device, such as a computer, smartphone, or laptop computer. The controller may cause the read/write circuitry 268 to read bits from particular storage elements of the 3D memory 226 by applying appropriate signals to the control lines to cause storage elements of a selected word line to be sensed. Accordingly, the 3D memory 226 having multiple conductive channels in a stacked configuration may be configured to read from and write data to one or more storage elements.

One or more of subblocks of memory cells 246 in an array of memory cells 246 may be coupled by a channel (e.g., a physical communication channel). In an embodiment, the channel comprises a bit line BL0-BL2 and/or a source line SL-SL2.

Figure 3:
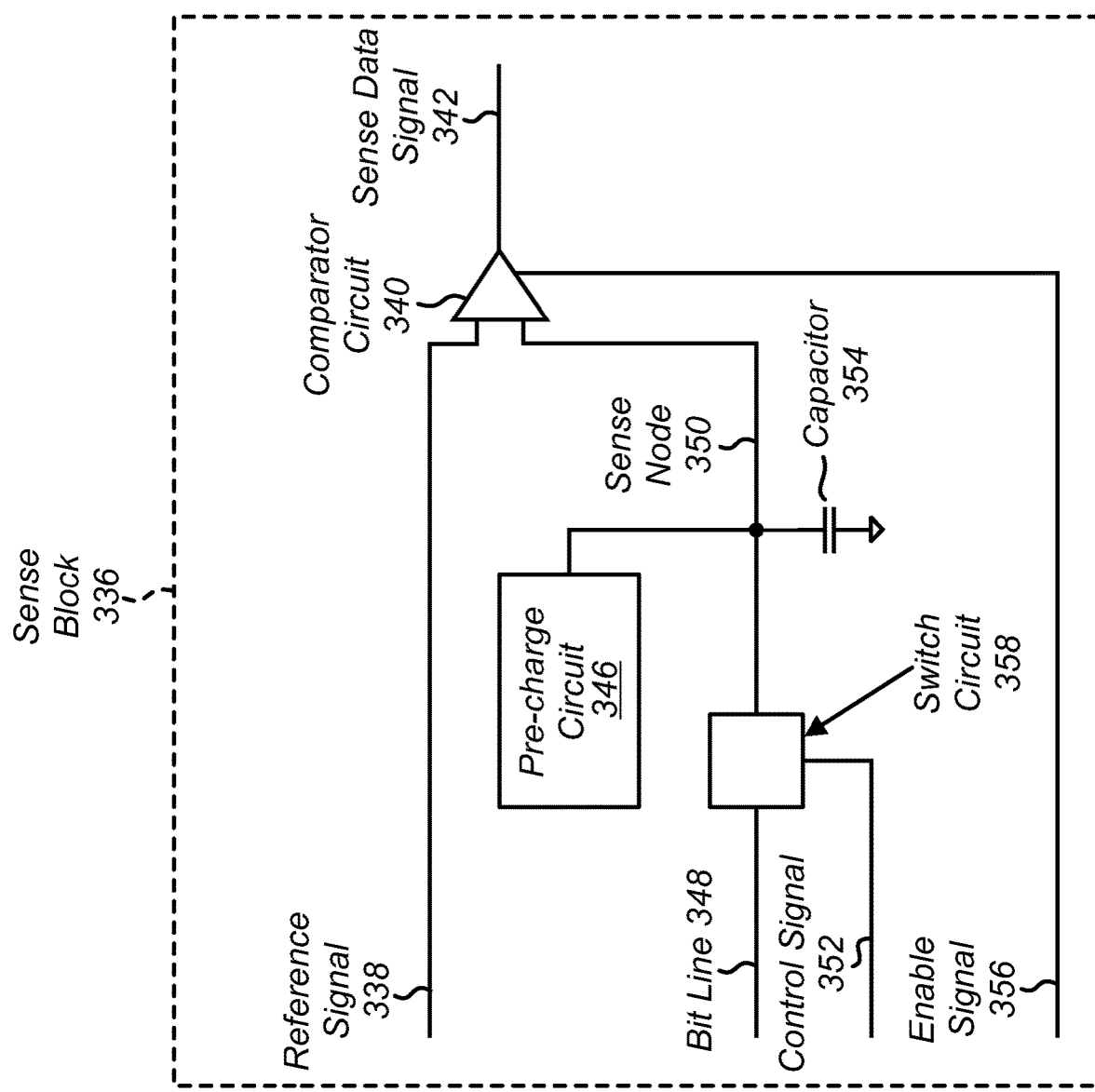
FIG. 3 is a block diagram illustrating an embodiment of a sense block.

Sense block 336 shown in FIG. 3 is an embodiment of a circuit that uses a particular technique for sensing a threshold voltage (e.g., a threshold voltage in a flash configuration or a resistive state in a resistive memory configuration) stored in a memory cell 246. As illustrated, sense block 336 includes switch circuit 358, pre-charge circuit 346, and comparator circuit 340.

In the illustrated embodiment, the switch circuit 358 selectively couples the bit line 348 to the sense node 350 based on a value of a control signal 352. In various embodiments, the switch circuit 358 may include a pass gate or other arrangement of transistors that is configured to couple a bit line 348 (e.g., BL0-BL4 of FIG. 2) to sense node 350 based on the value of the control signal 352.

Prior to the bit line 348 being coupled to the sense node 350, the pre-charge circuit 346 charges the sense node 350 to a particular voltage level (such as 3.0 volts). In various embodiments, the particular voltage level may be substantially the same as a voltage level of a power supply signal for the sense block 336. In some cases, the pre-charge circuit 346 may include a transistor that couples the sense node 350 to the power supply signal. Alternatively, the pre-charge circuit 346 may include a current mirror or other suitable circuit configured to deliver current to the sense node 350 in order to charge sense node 350 to the particular voltage level.

A capacitor 354 is coupled between the sense node 350 and a ground circuit node. In various embodiments, a value of the capacitor 354 may be selected to generate a sufficiently large time constant so that the comparator circuit 340 may detect changes in a voltage level of sense node 350. The capacitor 354 may be constructed using gate capacitance of one or more metal-oxide field-effect transistors (MOSFETs), a metal-oxide-metal structure, or any other suitable structure that provides a desired capacitance value and that can be fabricated using a semiconductor fabrication process.

After the sense node 350 is pre-charged to the particular voltage level, the switch circuit 358 is activated by the control signal 352, thus coupling bit line 348 to the sense node 350. Based on a voltage level of a sensing signal applied to a control gate of the selected memory cell and the threshold voltage level of the selected memory cell(s), the selected memory cell may or may not conduct current. In the case where the selected memory cell conducts current, the voltage level of the sense node 350 decreases as the capacitor 354 is discharged through the non-volatile memory string that includes the selected gate.

Thereafter, when the switch circuit 358 is deactivated by the control signal 352 and the enable signal 356 activates the comparator circuit 340, the comparator circuit 340 will compare the voltage level of the sense node 350 to the reference signal 338 and transmit a sense data signal 342 indicating whether the voltage level at the sense node 350 (which is controlled by the voltage stored in the capacitor 354) is at a higher or lower voltage level relative to the reference signal 338. If a memory cell coupled to the bit line 348 is conductive, the voltage released by the capacitor 354 will be diminished, thus signaling that the memory cell is conductive. On the other hand, if the memory cell coupled with the bit line 348 is nonconductive, the voltage released by the capacitor 354 will be higher (i.e., generally the voltage level to which the capacitor 354 was charged), thus signifying that the memory cell is nonconductive. The time during which the switch circuit 358 is active (placing the bit line 348 and thus the memory cell in electrical communication with the capacitor 354) may be referred to as a sensing time.

Figure 4:
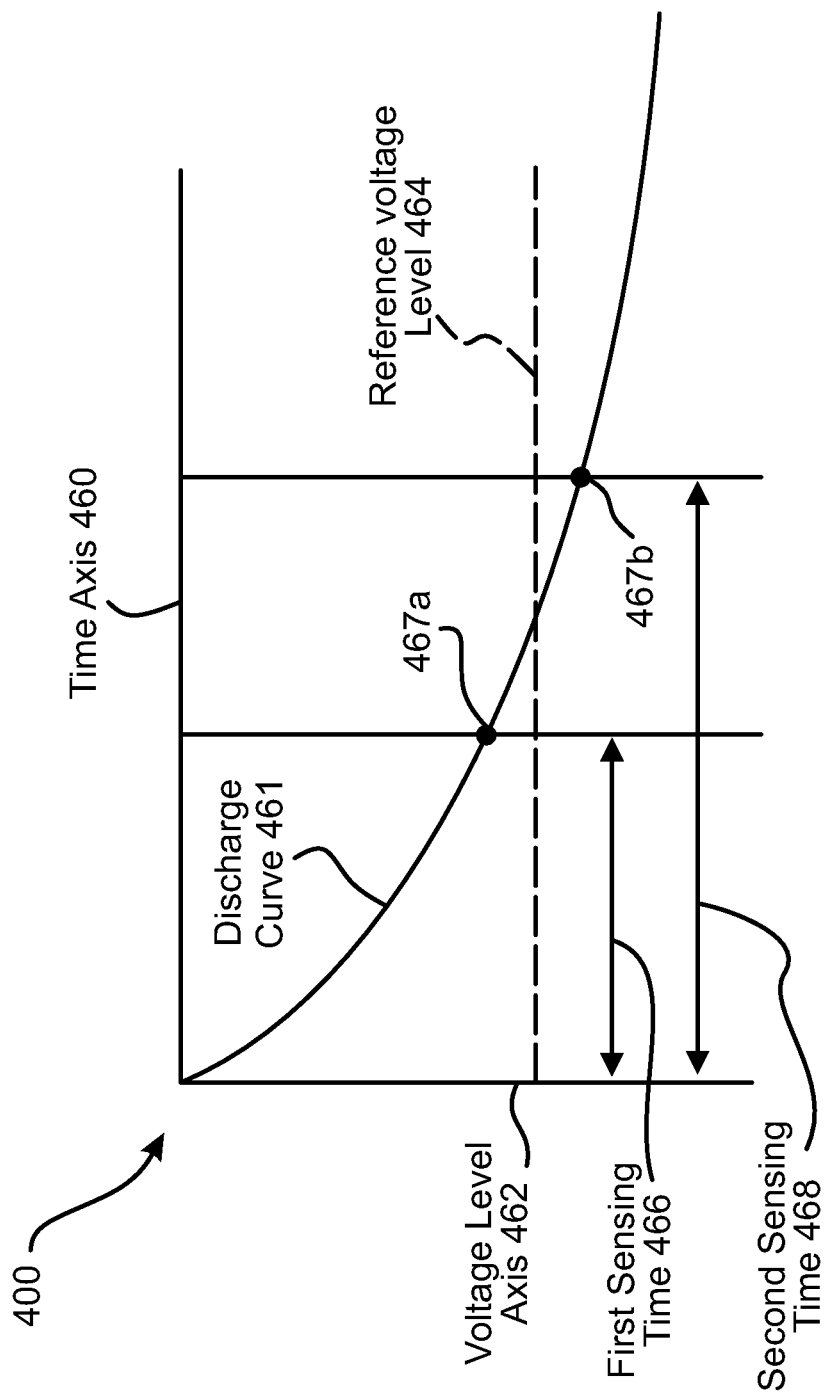
FIG. 4 is a graph illustrating an embodiment of a discharge curve of a capacitor for a sense block.

FIG. 4 is a graph 400 illustrating how the sensing time of the switch circuit 358 alters a determination of whether a memory cell coupled to the bit line 348 is found to be conductive. The graph 400 includes a time axis 460 and a voltage level axis 462. The discharge curve 461 illustrates a rate of discharge of the capacitor 354 when coupled to a memory cell that is conductive via the bit line 348. If the capacitor 354 is coupled to a nonconductive memory cell, the voltage level in the capacitor 354 will remain substantially the same. A reference voltage level 464 is also shown on the graph 400. If the sensed voltage level is greater than the reference voltage level 464, it is determined that the memory cell coupled with the bit line is nonconductive. If, however, the sensed voltage level is less than the reference voltage level 464, it is determined that the memory cell is conductive. As illustrated in FIG. 4, if a first sensing time 466 is employed with the discharge curve 461, it will be determined that the memory cell is nonconductive because the determined voltage level 467a will be greater than the reference voltage level 464. While, with the same discharge curve 461, if a second sensing time 468 is employed, it will be determined that the memory cell coupled to the bit line is conductive based on the determined voltage level 467b. Thus, by altering the sensing time (i.e., the time the switch circuit 358 is active), the determined threshold voltage of the memory cell may be shifted or altered to achieve a desired result.

FIG. 4 thus illustrates the effect of altering the sensing time on the determination of whether a memory cell coupled with the bit line is conductive. Furthermore, while the same voltage level is applied to the control gate via a word line, different threshold voltage levels in the memory cell may be verified by altering the sensing time, i.e., a shorter sensing time can be used to verify a lower threshold voltage level and a longer sensing time can be used to verify a higher threshold voltage level.

Figure 5:
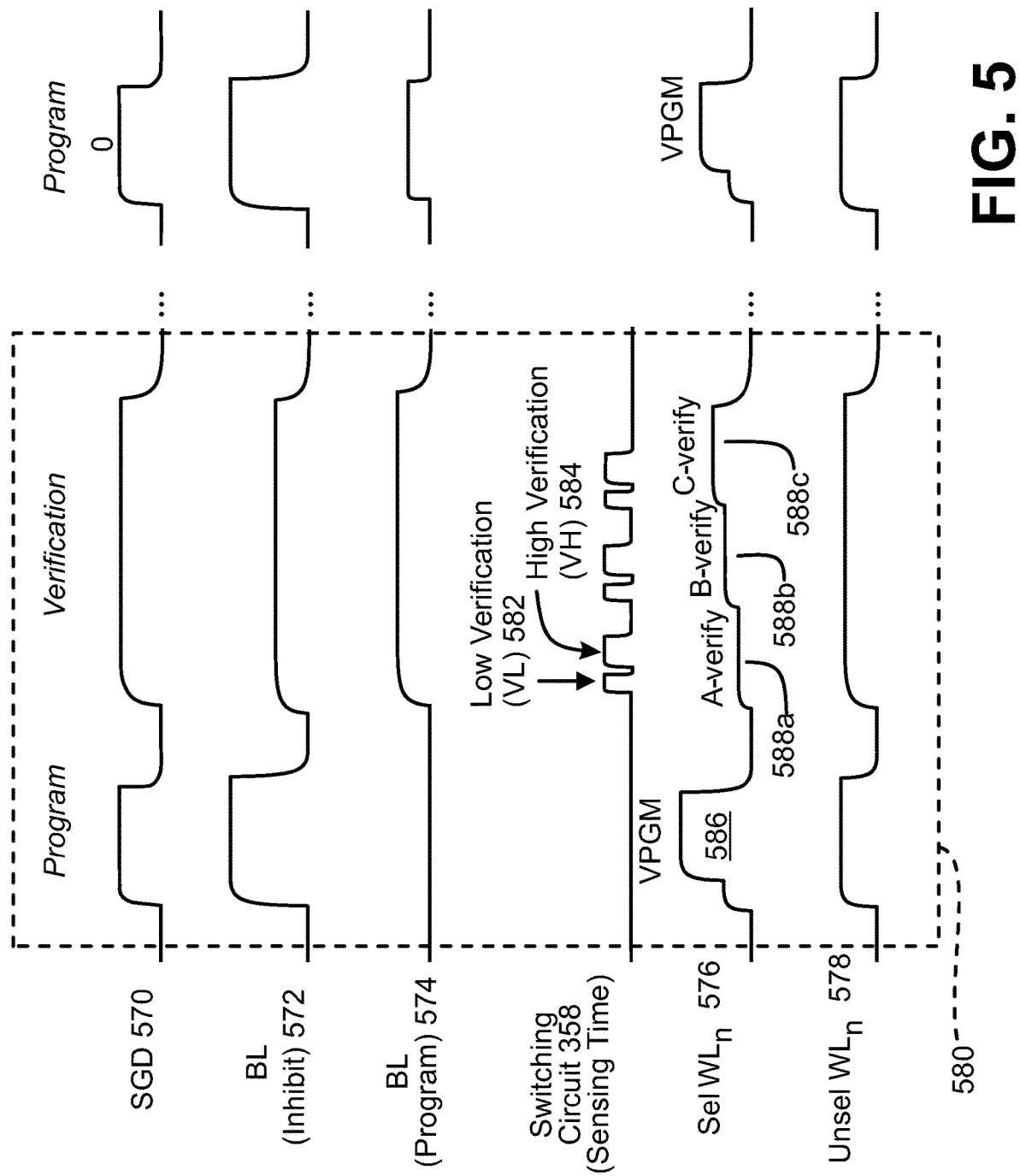
FIG. 5 is an embodiment of a timing diagram illustrating various sensing times and a program loop.

FIG. 5 comprises a timing diagram illustrating use of a shorter and longer sensing time to verify different voltage levels for a memory cell or a set of memory cells. The timing diagram includes a drain select gate (SGD) voltage 570, an inhibit bit line (BL) voltage 572, a program bit line (BL) voltage 574, a switching circuit 358 (which controls sensing time) voltage, a selected word line (SeL WLn) voltage 576, and unselected word line (Unsel WLn) voltage 578. As illustrated, program pulses 586 may have an amplitude or voltage referred to as "VPGM," and verify pulses have different voltages that may be referred to as "A-Verify" (to verify the A-state of a particular memory cell), "B-Verify" (to verify the B-state of a particular memory cell), and "C-Verify" (to verify the C-state of a particular memory cell).

After a program pulse 586 is applied on a selected word line (Sel WLn) 576, verification of the A state is initiated by applying a particular voltage level to the selected word line (using the A-verify pulse 588a), verification of the B state is initiated by applying a high voltage level (using a B-verify pulse 588b) to the selected word line, and verification of the C state is applied at yet another voltage level (using a C-verify pulse 588c). The switch circuit 358, sometimes referred to in the art as XXL, may be employed for a low verification 582, a verification of a low voltage level, applying a shorter sensing time ($T_{sen}-\Delta_{sen}$) and a high verification 584, a verification of a high voltage level, applying a higher sensing time ($T_{sen}$), without altering the voltage level applied during sensing for a particular state (e.g., the A state, B state, and C state). As a consequence, a first verification 582 and a second verification 584 may be applied for each particular state by altering sensing time while applying the same voltage level (588a-c) within sensing for each state.

The first and the second verifications 582, 584 illustrated in FIG. 5 may be employed in quick pass write procedures. Quick pass write involves slowing down programming (by increasing the threshold voltage stored in a memory cell in smaller increments) once a first verification level, such as the level associated with the low verification 582, is satisfied and then stopping programming after the second verification level, such as the level associated with the high verification 584, has been satisfied for each particular state. Verification is performed between each programming pulse in order to determine the threshold voltage of the memory cell in connection with quick pass write procedures. Further details related to quick pass write procedures are explained, for example, in FIG. 6 of U.S. Pat. No. 8,705,29 and the associated description.

FIG. 5 further illustrates a program loop 580, which comprises a period of time encompassing a programming pulse 586 and extends until another programming pulse 586 is issued or the particular programming procedure comes to an end. As illustrated, a program loop 580 encompasses a programming pulse followed by one or more verification pulses 588a-c. A series of program loops 580 may be executed or delivered to a memory cell or a set of memory cells (e.g., a set of memory cells coupled to a word line). Often, the magnitude or voltage level of the program pulse 586 increases with each program loop 580 until a threshold voltage in a memory cell achieves a desired level.

Figure 6A:
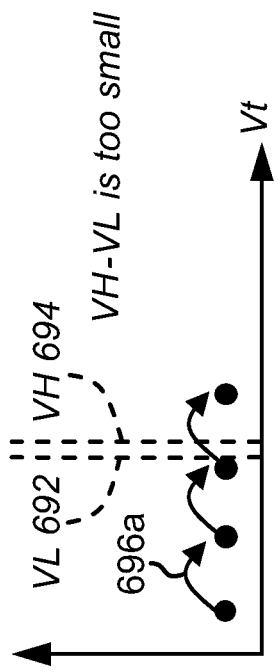
FIG. 6A-C comprise charts illustrating the impact of varying a difference between a high verification level and a low verification level during a quick pass write procedure.
Figure 6B:
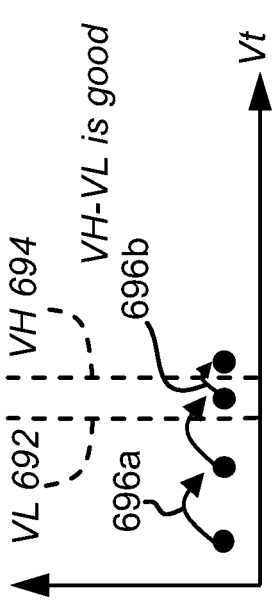
Figure 6C:
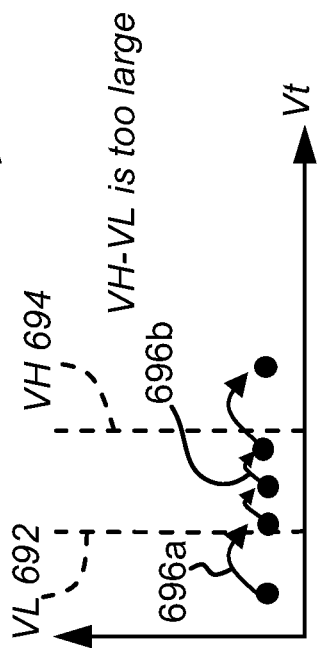

FIGS. 6A-6C comprise diagrams illustrating that a difference between a low verification level 692 (VL) and a high verification level 694 (VH) should be optimized in connection with quick pass write procedures. In FIGS. 6A-6C, the horizontal axis represents different voltage levels, while the vertical axis represents the number of cells at each voltage level. FIGS. 6A-6C also illustrate a series of programming steps 696a-b with a curved line having an arrow extending from a dot. The longer lines with arrows indicate larger programming steps 696a (i.e., a larger voltage increase in the threshold voltage level of the pertinent memory cell(s)), while the shorter lines with arrows indicate smaller programming steps 696b (i.e., a smaller voltage increase in the threshold voltage level of the pertinent memory cell(s)). "VL" signifies a low verification level 692 (verification that the threshold voltage level of the pertinent memory cell(s) has reached or exceeded a lower threshold voltage level), while "VH" represents the high verification level 694 (verification that the threshold voltage level of the pertinent memory cell(s) has reached or exceeded a higher threshold voltage level).

FIG. 6A illustrates that if the difference between the low verification level 692 and the high verification level 694 is too narrow, programming will not be slowed down (i.e., using smaller programming steps 696b) as the desired voltage level is approached because the threshold voltage level will never be positioned between the low verification level 692 and the high verification level 694. As a consequence, the memory cell(s) will be overprogrammed (i.e., the ultimate threshold voltage will be too high above the high verification level 694). FIG. 6B illustrates one ideal distance between the low verification level 692 and the high verification level 694 in that programming is slowed down after passing the low verification level 692 but before reaching the high verification level 694, causing the memory cell to be properly programmed to a desired threshold voltage level. FIG. 6C illustrates a situation in which the low verification level 692 is too far from the high verification level 694 because programming is slowed down for a protracted period of time. As indicated in FIG. 6C, the smaller programming steps 696b will be terminated, resulting in a large programming step 696a at the end of the programming sequence and a wider than desired variation in the final threshold voltage level. Once again, the pertinent memory cell(s) will be overprogrammed.

A rule of thumb for the difference between a high verification level 694 and a low verification level 692 (VH-VL), as illustrated in Equation 1, is provided below:

$$(VH - VL) \sim \frac{\Delta_{vpgm}}{2} \quad \text{(Equation 1)}$$

In this equation, VH-VL represents the difference between the high voltage verification level 694 and the low verification level 692. $\Delta_{vpgm}$ represents a difference between a voltage level of a programming pulse in the immediately prior program loop 580 and a programming pulse 586 in the current program loop 580. Thus, the desired difference between the low verification level 692 and high verification level 694 is approximately equal to one half of $\Delta_{vpgm}$, as indicated in Equation 1.

With reference now to FIG. 7, cell-to-cell variation (i.e., variation in how each particular memory cell responds—in terms of current flowing from source to drain—to a voltage level applied to the control gate of the memory cell) is undesirable. Because of, for example, manufacturing variation, applying the same voltage to control gates of different memory cells may result in different levels of current flowing from source to drain for different memory cells, thereby potentially resulting in an inaccurate assessment of the threshold voltage level in the memory cell.

The way in which a memory cell responds to a particular voltage level applied to the control gate may be measured and visualized employing an I-V graph 700 showing an I-V curve 723, in which the vertical axis shows current ($I_d$) flowing from source to drain on a logarithmic scale on the vertical axis 711 and the voltage applied to the control gate along the horizontal axis 712 ($V_g$), as illustrated in FIG. 7. As shown in this figure, when a first voltage level 719 ($V_1$) is applied to the control gate, a first current level 713 ($I_1$) flows from source to drain; and when a second voltage level 717 ($V_2$) is applied to the control gate, a second current level 715 ($I_2$) flows from source to drain. An activation response value (i.e., a value indicating how responsive a memory cell is to the application of different voltage levels in terms of current flowing through the memory cell from source to drain) of a particular memory cell may be measured using subthreshold slope (SS) 721. Subthreshold slope 721 may be calculated using the formula provided below in Equation 2:

$$SS = \frac{V_1 - V_2}{\log_{10}\left(\frac{I_1}{I_2}\right)} \quad \text{(Equation 2)}$$

The numerator of this equation is the difference between the two voltage levels 717, 719 applied to the control gate. The denominator is the $\log_{10}$ of the ratio of the first and second current levels 713, 715. A steeper subthreshold slope 721 is superior, signifying that the memory cell is more responsive (i.e., produces more distinct current levels) in response to different voltage levels. As will be explained subsequently, subthreshold slope 721 may also be calculated employing a different equation.

Figure 8:
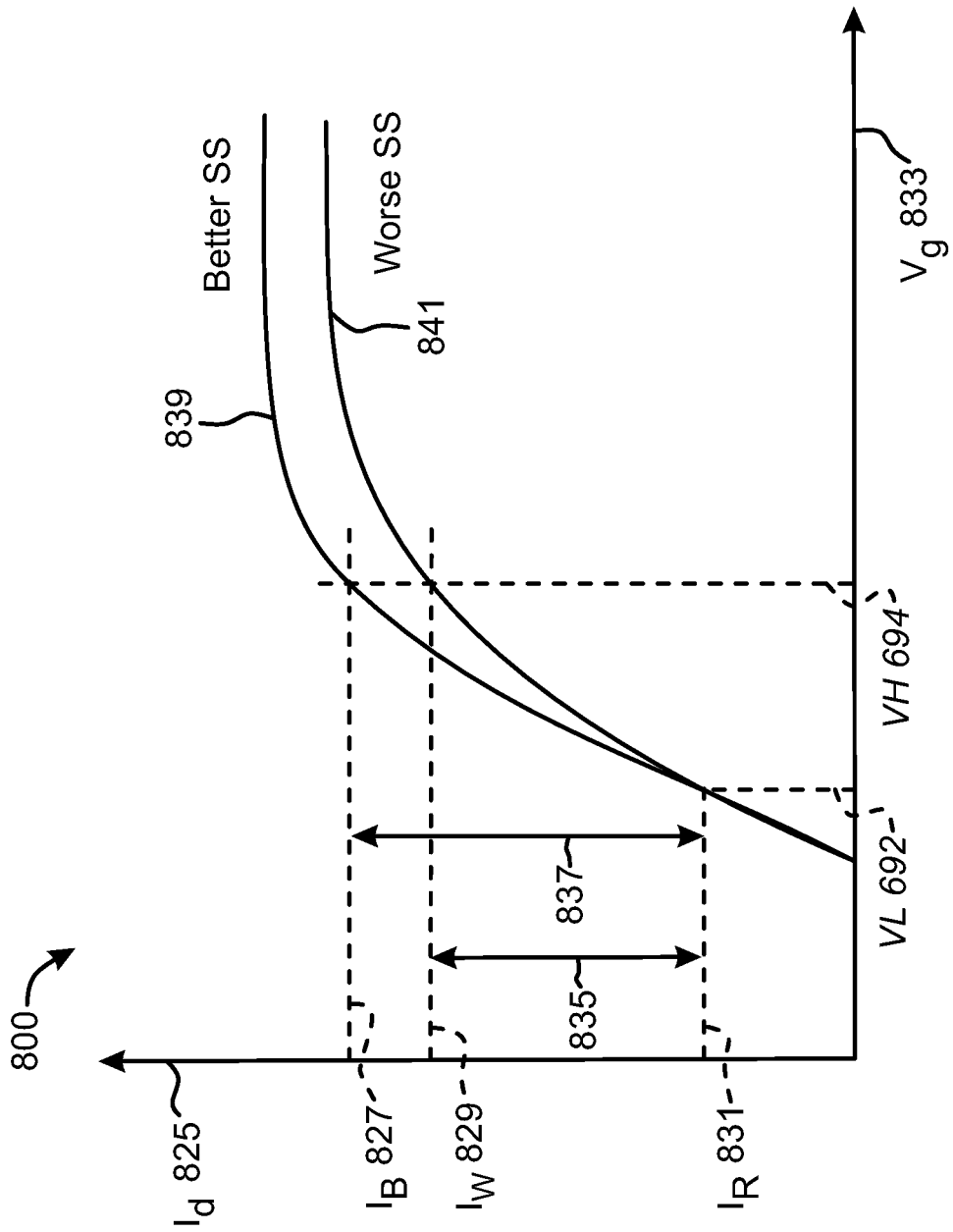
FIG. 8 is an I-V curve illustrating memory cells with different subthreshold slope.

FIG. 8 comprises an I-V graph 800 illustrating how a memory cell with better subthreshold slope (SS) responds differently than a memory cell with worse subthreshold slope (SS). The vertical axis represents current level ($I_d$ 825) from source to drain, and the horizontal axis represents the voltage level ($V_g$ 833) applied to the control gate. In particular, a first curve 839 illustrates the response of the memory cell with better subthreshold slope at two different voltage or verification levels 692, 694 applied to the control gate, while the second curve 841 illustrates the response of a memory cell with poor subthreshold slope at two different voltage levels 692, 694. As indicated previously "VL" signifies a low voltage level 692, while "VH" signifies a high voltage level 694. As illustrated in FIG. 8, when the low voltage level (VL) 692 is applied to both cells, the current ($I_R$) 831 from source to drain is approximately the same. However, when the high voltage level (VH) 694 is applied to both gates, different current levels 827, 829 flow from source to drain. In particular, current level ($I_W$) 829 flows from the memory cell having worse subthreshold slope, while the current level ($I_B$) 827 flows from the memory cell having better subthreshold slope. Accordingly, the difference between the current flowing as a result of the low verification level 692 and the high voltage level 694 is not the same in each memory cell (i.e., a first difference 837 between $I_R$ 831 and $I_B$ 827 is longer than a difference 835 between $I_R$ 831 and $I_W$ 829). The differences 835, 837 shown in FIG. 8 represent $\Delta_{sen}$. As a result, cells with a worse subthreshold slope require a smaller $\Delta_{sen}$ than cells with a better subthreshold slope. Thus, cells with different subthreshold slopes must be treated differently to effectively maintain and accurately measure a low verification level 692 and a high verification level 694. For example, if adjustments were not made for cells with different subthreshold slopes, inaccurate readings of the threshold voltage stored in a memory cell could occur, as different current levels could be detected.

FIGS. 9A-D comprise graphs illustrating that adjustments in sensing time may be made based on when cells pass a certain verification level (e.g., a low verification level (VL) 692). In particular, adjustments are made to the sensing time for the low verification level 692 (e.g., $T_{sen}-\Delta_{sen}$) after any cell reaches a first verification level (i.e., low verification level (VL) 692). In these figures, the horizontal axis represents different voltage levels, while the vertical axis represents the number of cells at each voltage level. These figures illustrate the voltage levels of fast cells 947, medium cells 949, and slow cells 951 during programming. The fast cells 947 have worse subthreshold slope than the medium cells 949 or slow cells 951. The fast cells 947 and medium cells 949 also have worse subthreshold slope than the slow cells 951. The threshold voltage levels of fast cells 947 will increase more rapidly than the medium cells 949 and the slow cells 951 in response to the application of the same voltage level (e.g., program pulses) to the respective control gates. The distribution curves of the threshold values in broken lines and solid lines 943, 945 illustrated in FIGS. 9A-D represent the distributions of a set of memory cells after a series of program loops are delivered. Distribution curves in broken lines 943 represent distributions for previously completed program loops, while the distribution curves in solid lines 945 in each figure illustrate the distribution of the threshold voltages after the most recent program loop has been completed.

As illustrated in FIG. 9A, the fast cells 947 will surpass the low verification level (VL) 692 more rapidly than the medium cells 949 or slow cells 951. Consequently, cells with different subthreshold slopes may be segregated based on when threshold voltage levels pass a particular verification level, such as the low verification level 692. Thus, as illustrated in FIG. 9A in program loop N 946a, the fast cells 947 have surpassed the low verification level 692 triggering a change in the next program loop (i.e., program loop N+1 946b) as to the sensing time for the low verification level 692. Program loop N 946a employs a default sensing time for the low verification level 692, for example, $T_{sen}-\Delta_{sen}$ (e.g., 1.2 µs–0.6 µs=0.6 µs).

In FIG. 9B in loop N+1 946b, a different, shorter sensing time is used for the low verification level 692, for example, $T_{sen}-\Delta_{sen}-\Delta t$ (e.g., 1.2 µs–0.6 µs–0.08 µs=0.52 µs) to accommodate the slow cells 951 and medium cells 949. It should be noted that as illustrated in FIG. 9B the fast cells 947 have already passed the high verification level (VH) 694 and consequently, further programming of those cells 947 will cease.

In FIG. 9C in loop N+2 946c, an even shorter sensing time is used for the low verification level 692, for example, $T_{sen}-\Delta_{sen}-2\Delta t$ (e.g., 1.2 µs–0.6 µs–(2×0.08 µs)=0.44 µs) to further accommodate the slow cells 951. As illustrated in FIG. 9C, the medium cells 949 have passed the high verification level 694 and thus further programming of those cells 949 will cease.

In FIG. 9D in program loop N+3 946d, an even shorter sensing time is used for the low verification level 692, for example, $T_{sen}-\Delta_{sen}-3\Delta t$ (e.g., 1.2 µs–0.6 µs–(3×0.08 µs)=0.36 µs). Following this program loop, the fast, medium and slow cells 947, 949, 951 have all passed the high verification level 694, resulting in a very tight distribution of cells just above the high verification level 694. Since all the cells have passed the high verification level 694, further programming of all cells for this programming session will cease.

The illustrations provided in FIGS. 9A-D are merely exemplary. It should be noted that in alternative embodiments, adjusting the sensing time may be applied to a different number of program loops, such as to two, three or five program loops. Also, adjustments of the sensing time for a high verification level (VH) 694 (instead of or in addition to adjustments to the sensing time for the low verification level (VL) 692) could also be made in various program loops. In addition, variations of the additional sense time (Δt) (i.e., varying the incremental time added to the sense time rather than merely altering a multiplier) may be made in various program loops.

FIG. 10 is a flow diagram of one embodiment of a method 1000 of altering sensing time. A program command is issued 1084 to program a memory cell. In accordance with the command, a program pulse is delivered 1086. Thereafter, it is determined 1088 whether any cell has satisfied a programming condition. For example, it is determined 1088 whether any cell has reached a low verification level (VL). If the programming condition has been satisfied, sensing time is decreased 1090 in the next program loop. If the programming condition has not been satisfied, it is then determined 1092 whether all cells have satisfied another programming condition, such as satisfying the high verification level (VH). If this programming condition is satisfied, programming is terminated 1094. If this programming condition is not satisfied, another programming pulse is delivered 1086. As indicated before, each program loop comprises delivering 1086 a program pulse and one or more verifications 1088, 1092.

Figure 11A:
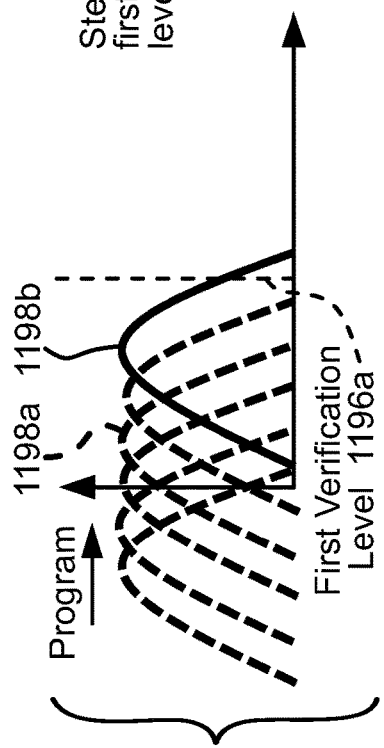

FIGS. 11A-F illustrate steps for adjusting a default sensing time based on calculated subthreshold slope for a set of one or more cells (such as cells connected to a single word line). In the graphs in FIGS. 11A-C, the horizontal axis represents different voltage levels, while the vertical axis represents the number of cells at each voltage level. The distribution curves 1198a-b in FIG. 11A represent a distribution of the threshold voltage levels along the horizontal axis for the set of cells. Distribution curves 1198a in broken lines represent the increasing voltage levels resulting from the application of programming pulses to the set of cells. The distribution curve 1198b in solid lines indicates that some of the cells of the distribution have passed the first verification level 1196a. Thus, in the first step illustrated in FIG. 11A, regular programming takes place until a first verification level 1196a is satisfied for at least one cell in the set of cells, such as an A-verify level (i.e., verification that the threshold voltage of at least one cell has reached the A state). As noted before, standard programming involves sending a series of programming pulses to the cell to gradually increase a threshold voltage in the set of memory cells using a first sensing time, which may be the default or standard sensing time. In the first step of FIG. 11A, a first sensing time may be used (e.g., $T_{sen}$=1.2 µs for a high verification and $T_{sen}-\Delta_{sen}$ (1.2 µs–0.6 µs=0.6 µs) for a low verification).

Figure 11B:
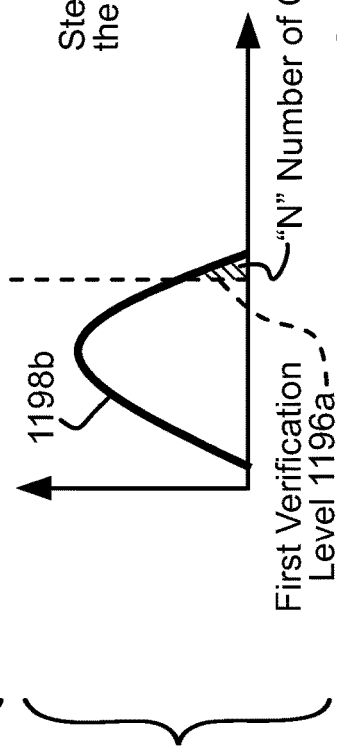

FIG. 11B depicts a second step and illustrates a distribution curve (represented in the distribution curve 1198b in solid lines) in which the number of cells (N) 1199a above the first verification level 1196a are counted.

Figure 11C:
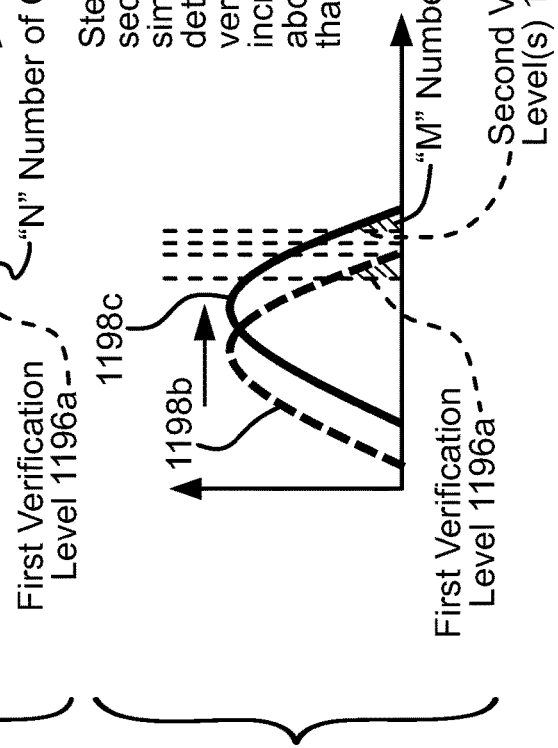

FIG. 11C illustrates a third step, in which the detected distribution curve is effectively shifted to a higher voltage level by reducing the sensing time, such as by reducing the first verification level 1196a from a first sensing time (e.g., 0.8 µs) to a second sensing time (e.g., 0.72 µs). In FIG. 11C, the distribution curve 1198b in broken lines is the same curve shown above in solid lines in FIGS. 11A and 11B using the first sensing time. The distribution curve 1198c in solid lines in FIG. 11C represents the new position of the detected distribution curve employing the second sensing time. While using the distribution curve 1198c generated using the second sensing time, the verification level (by increasing a voltage level applied to the control gates for the set of memory cells) is incrementally increased from a first verification level 1196a until the number of cells (M) 1199b above the increased verification level is less than or equal to N 1199a at a second verification level 1196b. In one embodiment, the verification level is increased from the first verification level 1196a to the second verification level 1196b in increments of 50 mV.

In FIG. 11D, which illustrates a fourth step, a delta (Δ) is calculated by subtracting the voltage level of the first verification level 1196a from the voltage level of the second verification level 1196b.

In FIG. 11E, which illustrates a fifth step, a subthreshold slope (SS) is calculated based on the calculated delta (Δ). Equation 3, which is provided below may be used to calculate the subthreshold slope.

$$ss = \frac{\Delta}{\log_{10}\left(\frac{t_{S1}}{t_{S2}}\right)} \qquad \text{(Equation 3)}$$

In Equation 3, $t_{S1}$ represents the first sensing time (e.g., 1.0 µs) referenced in the first step and $t_{S2}$ represents the second sensing time referenced in the third step. It should be noted that either Equation 2 or Equation 3 may be used to calculate subthreshold slope.

In FIG. 11F, which represents a sixth step, a mapping table is used to compute a new sensing time. In one embodiment, the new sensing time relates to a low verification level 692 and the value produced using the sensing table is $\Delta_{sen}$, which may be employed to calculate the sensing time for a low verification by subtracting $\Delta_{sen}$ from the sensing time for a high verification level (i.e., $T_{sen}-\Delta_{sen}$). Table 1 provided below serves as one example of a mapping table. Accordingly, if $T_{sen}$=1.2 µs, and the calculated subthreshold slope is 850 mV/dec, then the sensing time for the low verification level 692 would be 0.5 μs (i.e., 1.2 μs–0.7 μs). Please note that in Table 1, the abbreviation "dec" represents a decade. A decade corresponds to a ten-fold increase in current.

TABLE 1

| SS | $\Delta_{sen}$ |
|---|---|
| ... | ... |
| 800 mV/dec | 0.80 μs |
| 850 mV/dec | 0.70 μs |
| 900 mV/dec | 0.60 μs |
| 950 mV/dec | 0.50 μs |
| 1000 mV/dec | 0.40 μs |
| 1050 mV/dec | 0.30 μs |
| ... | ... |

The steps outlined in FIGS. 11A-F may be implemented to set a default sensing time, e.g., a default sensing time for a high verification level and/or a default sensing time for a low verification level. These default levels may be used, for example, until a low verification level is satisfied. After the low verification has been satisfied, in one embodiment, the sensing time for the low verification level may be modified in accordance with, for example, the method set forth in FIG. 10, while the sensing time for the high verification level may remain constant both before and after the low verification level has been satisfied. The method in FIG. 10 may apply on a per cell basis, while the steps set forth in FIGS. 11A-F may apply to a set of cells, such as all cells coupled to a particular word line.

As indicated above, $\Delta_{sen}$ comprises a type of sensing time modifier. That is, $\Delta_{sen}$ may be used to modify $T_{sen}$ in the following equation in order to compute a sensing time for a low verification level 692: $T_{sen} - \Delta_{sen}$.

Figure 12:
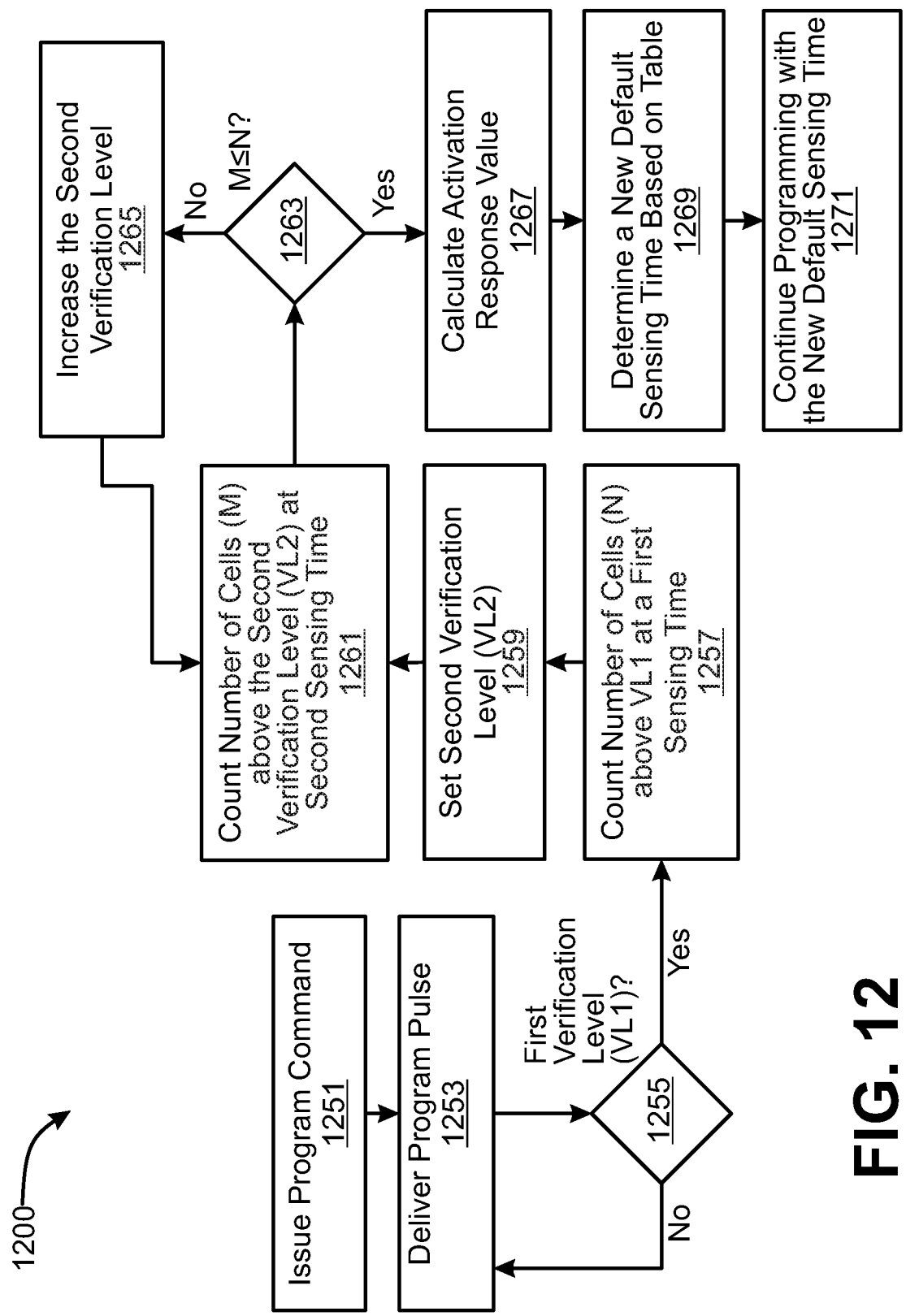
FIG. 12 is a flow diagram illustrating one embodiment of calculating an activation response value and altering a default sensing time based on the calculated activation response value.

FIG. 12 is a flow diagram illustrating a method 1200 for setting a default sensing time (e.g., a sensing time for a low verification level). The method 1200 shown in FIG. 12 is analogous to the steps shown in FIGS. 11A-F.

The program command may be issued 1251 for a set of memory cells. Thereafter, a program pulse may be delivered 1253 to the set of memory cells, such as via word line. Thereafter, it is determined 1255 whether a first verification level (VL1) has been satisfied. If the first verification level has not been satisfied, another program pulse is delivered 1253. Steps 1253 and 1255 are completed until the first verification level is satisfied.

If the first verification level has been satisfied, the number of cells (N) above the first verification level at a first sensing time ($t_{S1}$, e.g., 1.0 us) are counted 1257. Thereafter, a second verification level (VL2) is set 1259, for example, to a level 50 mV above the first verification level (e.g., VL2=VL1+50 mV). Then, the number of cells (M) above a second verification level (VL2) at a second sensing time ($t_{S2}$, e.g., 0.5 μs) are counted 1261. It is then determined 1263 whether M is less than or equal to N. If M is not less than or equal to N, the second verification level is increased 1265 (e.g., VL2=VL2+50 mV) and the number of cells (M) above the second verification level at a second sensing time are counted 1261 again. These steps 1261, 1263, 1265 are repeated until it is determined 1263 that M is less than or equal to N.

After it is determined 1263 that M is less than or equal to N, the activation response value is calculated 1267 employing delta (Δ) Delta (Δ) is a difference between the voltage level of the first verification level and the voltage level of the second verification level, i.e., the second verification level when it was determined 1263 that M was less than or equal to N using the second sensing time ($t_{S2}$). The activation response value of the set of cells may be gauged employing subthreshold slope (SS) using, for example, Equation 3, as explained in connection with FIGS. 11D-E.

Employing the calculated activation response value (e.g., subthreshold slope), a new default sensing time may be determined 1269 based on, for example, Table 1. For example, the sensing time for the low verification level may be calculated as $T_{sen}$ (the sensing time for a high verification level) minus $\Delta_{sen}$ from Table 1. Then, programming may continue 1271 employing the new default sensing time (e.g., a default sensing time for the low verification level based on $\Delta_{sen}$).

It should be noted that in an alternate embodiment, the default sensing time may be calculated and employed outside of the context of issuing a program command. In other words, steps 1253, 1255, 1257, 1259, 1261, 1263, 1265, 1267, 1269, 1271 may be implemented as a standalone procedure independent of a programming command. In such a scenario, a new default sensing time may be used in connection with subsequent programming commands and program loops.

Figure 13:
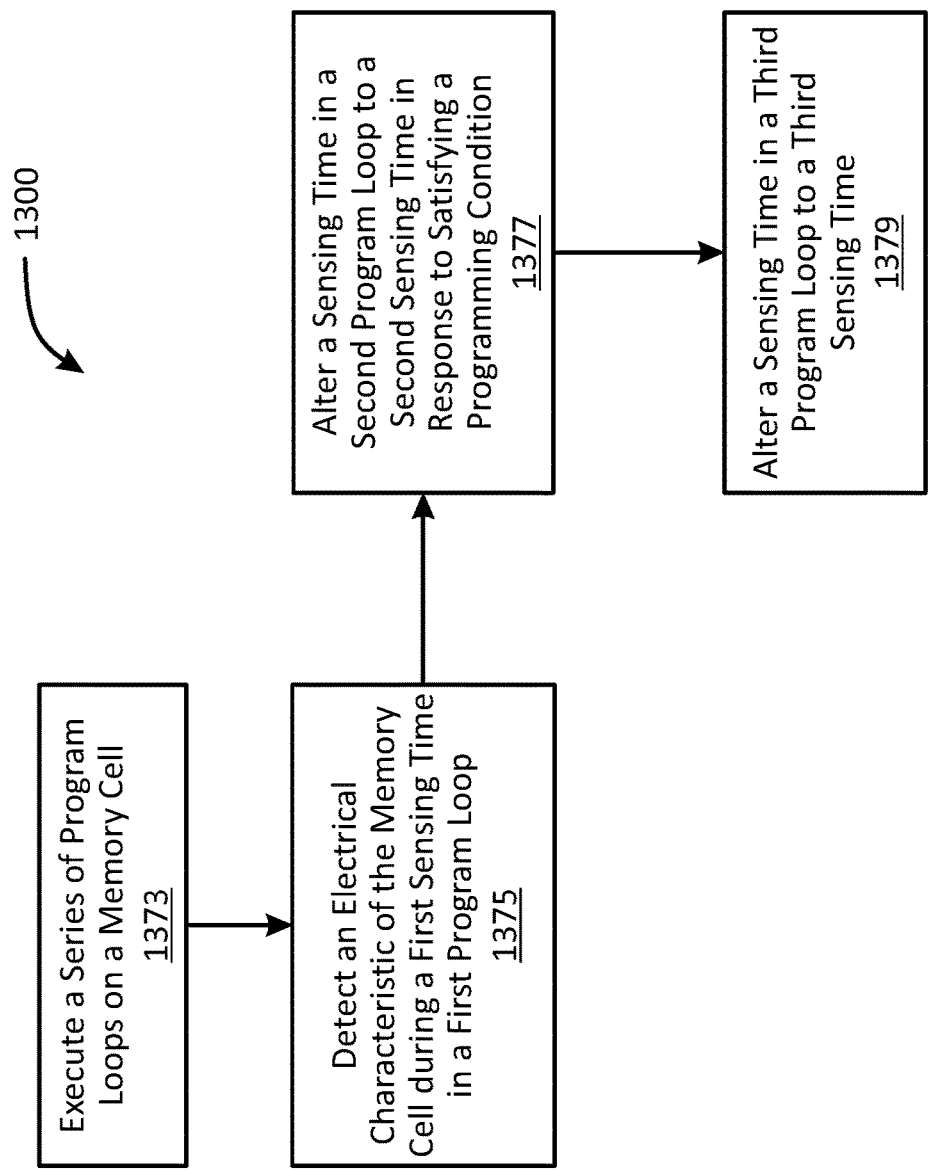
FIG. 13 is a flow diagram illustrating one embodiment of a method for altering sensing time based on satisfaction of a programming condition.

FIG. 13 is a flow diagram illustrating a method 1300 for altering sensing time for a program loop based on an electrical characteristic of a memory cell. In a first step, a series of program loops are executed 1373 on the memory cell. As indicated previously, each program loop 580 may comprise a program pulse 586 followed by one or more verification pulses for the purposes of ascertaining the effect of the program pulse 586 on the pertinent memory cell (e.g., by what amount was the threshold voltage of the memory cell increased by the program pulse 586).

An electrical characteristic (e.g., a threshold voltage level) of the memory cell during a first sensing time is detected 1375. This step may involve, for example, detecting a low verification level (VL) for a first sensing time, as explained, for example, in connection with FIG. 9A and with step 1088 of FIG. 10.

Thereafter, in a second program loop the sensing time is altered 1377 to a second sensing time in response to satisfying a programming condition. The programming condition could comprise the memory cell satisfying a trigger threshold, such as a trigger threshold voltage level or range. The programming condition could also comprise completion of a predetermined number of program loops. A programming condition could also comprise calculating an activation response value (e.g., a subthreshold slope or computation of a rate at which a set of one or more cells respond to a sensing signal) for a memory cell or a set of memory cells, as explained, for example, in connection with steps 1255, 1257, 1259, 1261, 1263, 1265 and 1267 of FIG. 12.

A sensing time in a third program loop may be altered 1379 to a third sensing time. The third sensing time may be shorter than or merely different from to the first sensing time. As indicated previously, this may involve altering a sensing time associated with a low verification level (VL) as explained in connection with, for example, FIG. 9C-9D and in connection with step 1090 of FIG. 10. It should be noted that step 1379 is optional and, in one embodiment, of the method 1300, only steps 1373, 1375, and 1377 are performed.

As indicated in connection with FIG. 9D, it should be noted that the sensing time may be altered in a fourth program loop. In addition, it should also be noted that the sensing time may be altered by the same incremental amount (A) between each program loop after the programming condition has been satisfied, as indicated in connection with FIGS. 9A-D and FIG. 10. Also, the sensing time could be decreased when, for example, the programming condition is whether a particular activation response value (e.g., a level of subthreshold slope or a rate at which a set of one or more cells respond to a sensing signal) is calculated for a memory cell or a set of memory cells.

Figure 14:
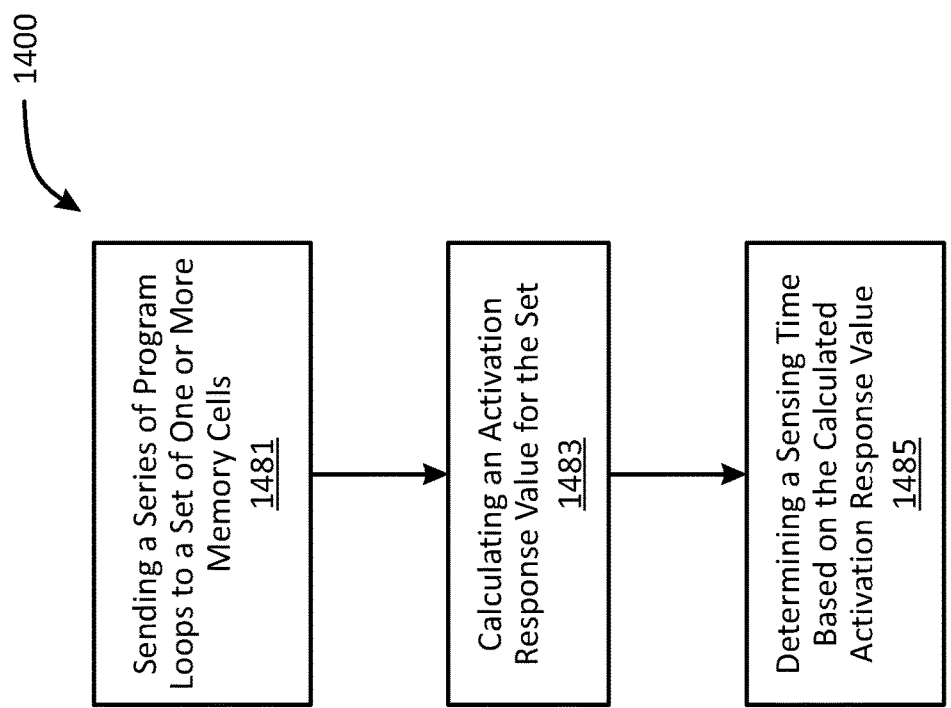
FIG. 14 is a flow diagram illustrating a method for determining sensing time based on a calculated activation response value.

FIG. 14 is a flow diagram illustrating a method 1400 of altering a default sensing time (such as altering a sensing time for a low verification level, e.g., $T_{sen}-\Delta_{sen}$) A series of program loops are sent 1481 to a set of one or more memory cells. As noted, the set of one or more memory cells may comprise all memory cells coupled to a particular word line.

Thereafter, an activation response value for the set may be calculated 1483. The activation response value refers to a value indicating how a particular memory cell or set of memory cells responds to a voltage level applied to the control gate for that memory cell or set of memory cells. As illustrated, for example, in FIG. 8, memory cells may respond differently to the same voltage level (e.g., a sensing signal) being applied to the control gate, i.e., different current levels may flow through different memory cells in response to the same voltage level being applied to the respective control gates. One measure of the activation response value is the subthreshold slope. The calculation of subthreshold slope is explained, for example, in connection with FIG. 11E and step 1267 of FIG. 12. This calculation may be performed employing Equation 3.

In an embodiment, the subthreshold slope may be referred to as a rate at which one or more memory cells respond to a sensing signal. Step 1483 of FIG. 14 involves determining a rate at which a set of memory cells respond to a sensing operation. The sensing operation could comprise, for example, determination of whether the threshold voltage level of a particular memory cell satisfies a low verification level or a high verification level. As indicated in step 1485, subsequent sensing time may be set based on the determined rate.

Figure 15:
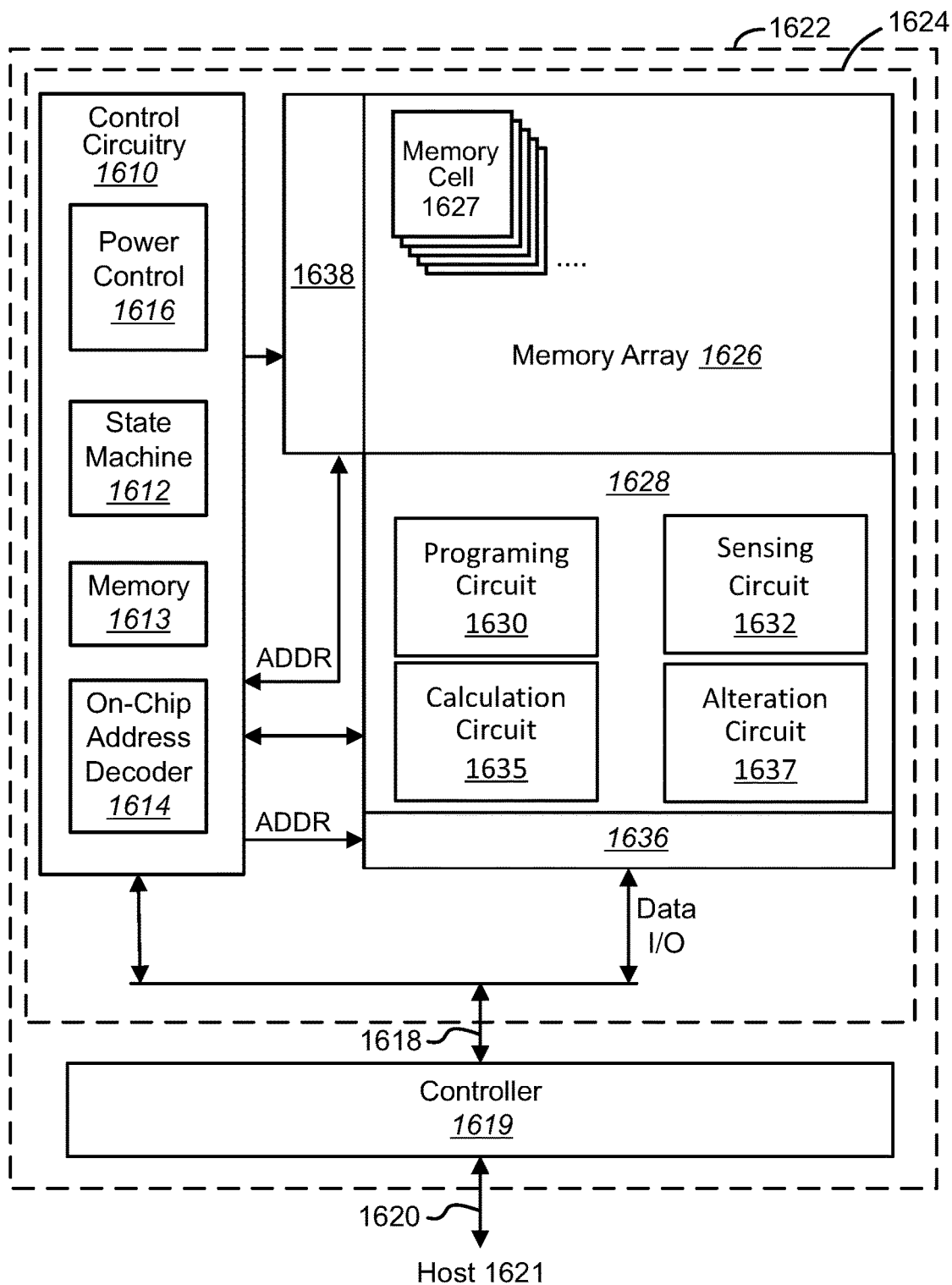
FIG. 15 is a block diagram illustrating one embodiment of a non-volatile memory system.

FIG. 15 is a block diagram of a non-volatile memory system using single row/column decoders and read/write circuits. The diagram illustrates a memory device 1622 having read/write circuits for reading and programming a page of memory cells 1627, according to one embodiment. The memory device 1622 may include one or more memory die 1624. The memory die 1624 includes a two-dimensional memory array 1626 of memory cells 1627, control circuitry 1610, and read/write circuits 1628.

In some embodiments, the array 1626 of memory cells 1627 can be three dimensional, as illustrated in FIG. 2. The memory array 1626 is addressable by word lines via a row decoder 1638 and by bit lines via a column decoder 1636. The read/write circuits 1628 include a programming circuit 1630, a sensing circuit 1632 (e.g., multiple sense blocks 236), a calculation circuit 1635 and an alteration circuit 1637. The read/write circuits 1628 allow a page of memory cells 1627 to be read or programmed in parallel.

In an embodiment, the programming circuit 1630 is configured to deliver (or supply) program loops 580 to the memory array 1626. Each program loop 580 encompasses a single program pulse 586 and extends until a subsequent program pulse 586 is sent. For example, the programming circuit 1630 sends a series of program pulses 586 to a selected word line coupled to memory cells 1627 of the memory array 1626. The program pulses 586 may increase in amplitude (e.g., increase in voltage in a linear or nonlinear manner) over a number of programming cycles to progressively (or incrementally) increase the threshold voltages of the memory cells 1627 (e.g., a threshold voltage in a flash configuration or a resistive state in a resistive memory configuration) to states corresponding to data being stored. The term "progressively" or "incrementally" means occurring in steps over time (e.g., over a number of program loops).

A calculation circuit 1635 is configured to determine an activation response value for a set of one or more cells. As noted above, the activation response value indicates how a particular memory cell or set of memory cells responds to a voltage level applied to the pertinent control gate(s). One measure of the activation response value is subthreshold slope, which may be calculated in various ways, as indicated above, in connection with Equation 2 and Equation 3. In an embodiment, the calculation circuit 1635 may be configured to perform the steps 1257, 1259, 1261, 1263, 1265, 1267 of FIG. 12 or step(s) outlined in connection with FIG. 11E. Thus, the calculation circuit 1635 may be configured to calculate the activation response value based on a voltage difference between a first distribution of threshold values of a set of memory cells employing a first sensing time ($t_{S1}$) and a second distribution of threshold values of the set employing a second sensing time ($t_{S2}$), as explained in connection with FIGS. 11C-E. This voltage difference may be calculated based on a difference between a first verification level 1196a and a second verification level 1196b, wherein a number of cells in the second distribution above the second verification level 1196b is less than or equal to a number of cells in the first distribution above the first verification level 1196a.

The alteration circuit 1637 is configured to alter the sensing time for one or more verifications. For example, the alteration circuit 1637 may be configured to perform the function(s) explained in connection with FIGS. 9A-D, step 1090 of FIG. 10, FIG. 11F and steps 1269 and/or 1231 of FIG. 12. Thus, the alteration circuit 1637 may perform an alternation in response to a programming condition being satisfied (e.g., a number of program loops have been performed or the threshold voltage level in a particular cell has been detected). In one embodiment, the alteration circuit 1637 is configured to alter the sensing time of the subsequent program loop in response to a programming condition. The alteration circuit 1637 may also alter the default sensing time based on the calculated activation response value (e.g., calculated subthreshold slope). The programming condition could also comprise computation of an activation response value (e.g., subthreshold slope or a rate at which a set of one or more cells respond to a sensing signal). The default sensing time may be defined as the sensing time employed prior to a programming condition being satisfied.

In an embodiment, the read/write circuits 1628 includes a pass circuit (not shown) in FIG. 15. The pass circuit is configured to deliver one or more pass pulses to unselected word lines of the memory array 1626. In an embodiment, the pass circuit is configured to increase a voltage of unselected word lines after the initiation of and during one or more program pulses.

Typically, a controller 1619 is included in the same memory device 1622 (e.g., a removable storage card) for the one or more memory die 1624. Commands and data are transferred between the host and controller 1619 via bus 1620 and between the controller 1619 and the one or more memory die 1624 via lines 1618.

The control circuitry 1610 cooperates with the read/write circuits 1628 to perform memory operations on the memory array 1626, and includes a state machine 1612, an on-chip address decoder 1614, and a power control module 1616. The state machine 1612 provides chip-level control of memory operations. The on-chip address decoder 1614 provides an address interface between that used by the host 1621 or a memory controller to the hardware address used by the decoders 1636 and 1638. The power control module 1616 controls the power and voltages supplied to the word lines and bit lines during memory operations. A memory 1613 can store original write data, modified write data, and status bits for use by the state machine 1612.

In some implementations, some of the components of FIG. 15 can be combined. In various designs, one or more of the components (alone or in combination), other than memory array 1626, can be thought of as a managing or control circuit. For example, one or more control circuits may include any one of, or a combination of, control circuitry 1610, state machine 1612, decoders 1614/1636/1638, power control module 1616, read/write circuits 1628, programming circuit 1630, sensing circuit 1632, calculation circuit 1635, alteration circuit 1637 and/or controller 1619, and so forth.

In another embodiment, a non-volatile memory system uses dual row/column decoders and read/write circuits. The various peripheral circuits access opposite sides of the memory array 1626 so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 1626. In this way, the density of the read/write modules is essentially reduced by one half.

An embodiment of an apparatus disclosed herein includes a programming circuit configured to deliver a series of program loops to a memory cell. The apparatus further includes a sensing circuit configured to sense an electrical characteristic of the memory cell for a sensing time during each program loop. The apparatus also includes an alteration circuit configured to alter the sensing time of a subsequent program loop in response to a programming condition.

In an embodiment of the apparatus, the programming condition comprises the electrical characteristic of the memory cell satisfying a trigger threshold. In an embodiment, the programming condition comprises completion of a number of the program loops. In an embodiment, the programming condition comprises computation of a rate at which a set of one or more cells respond to a sensing signal. In an embodiment, the alteration circuit alters a default sensing time.

A method disclosed herein includes executing a series of program loops on a memory cell. The method also includes detecting a threshold voltage of the memory cell during a first sensing time in a first program loop. The method further comprises altering a sensing time in a second program loop to a second sensing time in response to the threshold voltage of the memory cell satisfying a trigger threshold, such as a trigger threshold voltage level or range. The method also includes altering a sensing time in a third program loop to a third sensing time shorter than the first sensing time.

In an embodiment of the method, altering the sensing time comprises decreasing the sensing time. An embodiment also comprises determining a rate at which a set of memory cells respond to a sensing operation and setting the first sensing time based on the determined rate. In an embodiment of the method, a first difference between the first sensing time and the second sensing time is equal to a second difference between the second sensing time and the third sensing time.

An embodiment of another apparatus disclosed herein includes a memory die comprising a memory cell. The apparatus further includes a programming circuit configured to send a series of program loops to the memory cell, wherein each program loop comprises a first verification and a second verification. The apparatus also comprises a sensing circuit configured to detect a threshold voltage level of the memory cell during the first verification for a first time period in a first program loop. The apparatus further comprises means for decreasing the first verification to a second time period during a second program loop in response to a programming condition. The apparatus comprises means for decreasing the first verification to a third time period during a third program loop, the third time period being shorter than the second time period. An embodiment of the apparatus further comprises means for determining a first time period for the first program loop based on a computed rate at which a set of one or more cells in the memory cell respond to a sensing signal.

An embodiment of another apparatus disclosed herein comprises a programming circuit configured to execute one or more program loops on a set of one or more memory cells. The disclosed apparatus further comprises a calculation circuit configured to calculate an activation response value for the set of one or more memory cells. The apparatus also comprises an alteration circuit configured to determine a sensing time for a subsequent program loop based on the calculated activation response value for the set.

In an embodiment, the calculation circuit is configured to calculate the activation response value based on a voltage difference between a first distribution of threshold values of the set employing a first sensing time and a second distribution of threshold values of the set employing a second sensing time with the second sensing time being less than the first sensing time. In one embodiment, the voltage difference is calculated based on a difference between a first verification level and a second verification level, wherein a number of cells in the second distribution above the second verification level is less than or equal to a number of cells in the first distribution above the first verification level. In an embodiment, the alteration circuit is configured to alter the sensing time in response to a program condition. In one embodiment, the programming condition comprises a threshold voltage of a memory cell of the set satisfying a trigger threshold.

Another method disclosed herein comprises sending a series of program loops to a set of one or more memory cells. The method further includes calculating a subthreshold slope for the set based on a voltage difference between a first distribution of threshold values of the set employing a first sensing time and a second distribution of the threshold values of the set employing a second sensing time. The method also includes determining a third sensing time based on the calculated subthreshold slope for the set.

An embodiment of the method further comprises generating a sensing time modifier based on the calculated subthreshold slope employing a mapping table, wherein the sensing time modifier is used to calculate the third sensing time. In an embodiment of a method, the third sensing time is a default sensing time. An embodiment of the method further comprises altering the sensing time relative to the default sensing time in response to a program condition.

An embodiment of another apparatus comprises a memory die comprising a memory cell. The apparatus also comprises a programming circuit configured to send a series of program loops to the memory cell, wherein each program loop comprises a range. The apparatus also comprises a sensing circuit configured to detect that a threshold voltage level of the memory cell is within the range using a first verification for a first time period in a first program loop. The apparatus additionally includes means for decreasing the first verification to a second time period during a second program loop in response to a programming condition. The apparatus also comprises means for decreasing the first verification to a third time period during a third program loop, the third time period being shorter than the second time period.

In an embodiment of the apparatus, the sensing circuit is configured to detect that the threshold voltage level of the memory cell is outside of the range using a second verification for a fourth time period, wherein the fourth time period is shorter than the first time period. In an embodiment of the apparatus, each program loop comprises the first verification and a second verification.

Means for decreasing a verification to another time period during a program loop in response to a programming condition comprises at least the memory 1613, controller 1619, calculation circuit 1635, and alteration circuit 1637. Other embodiments include similar or equivalent means for decreasing a verification to another time period.

Means for determining a time period for a program loop based on a computed rate at which a set of one or more cells in the memory cell respond to a sensing signal comprises at least the memory 1613, controller 1619, calculation circuit 1635, and alteration circuit 1637. Other embodiments include similar or equivalent means for determining a time period.

One of skill in the art will recognize that this disclosure is not limited to the two-dimensional and three-dimensional exemplary structures described but covers all relevant memory structures within the spirit and scope of the disclosure as described herein and as understood by one of skill in the art. The illustrations of the embodiments described herein are intended to provide a general understanding of the embodiments. Other embodiments may be utilized and derived from the disclosure, such that structural and logical substitutions and changes may be made without departing from the scope of the disclosure. This disclosure is intended to cover any and all subsequent adaptations or variations of embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents and shall not be restricted or limited by the foregoing detailed description.

What is claimed is:

1. An apparatus, comprising:
a programming circuit configured to deliver a series of program loops to a set of memory cells;
a sensing circuit configured to determine that a voltage level of at least one memory cell of the set of memory cells exceeds a first verification level corresponding to a default sensing time during a first program loop; and
an alteration circuit configured to alter the default sensing time to a second sensing time of a second program loop in response to the voltage level of the at least one memory cell exceeding the first verification level,
wherein altering the default sensing time to the second sensing time is based upon a subthreshold slope of one or more of the set of memory cells.

2. The apparatus of claim 1, wherein the second sensing time is less than the default sensing time.

3. The apparatus of claim 1, wherein upon the voltage level of all memory cells in the set of memory cells exceeding a second verification level, programming of the set of memory cells terminates.

4. The apparatus of claim 3, wherein a difference in the voltage level of the first verification level and the second verification level corresponds to about half of a difference between the voltage level of a programming pulse in the first program loop and the second program loop.

5. A method, comprising:
executing a series of program loops on a memory cell;
detecting a threshold voltage of the memory cell during a first sensing time in a first program loop; and
altering the first sensing time in a second program loop to a second sensing time in response to the threshold voltage of the memory cell satisfying a trigger threshold voltage; and
altering the second sensing time in a third program loop to a third sensing time,
wherein altering the first sensing time to the second sensing time is based upon a subthreshold slope of the memory cell.

6. The method of claim 5, wherein the second sensing time is less than the first sensing time, and wherein the third sensing time is less than the second sensing time.

7. The method of claim 5, further comprising:
determining a rate at which a set of memory cells respond to a sensing operation; and
setting the first sensing time based on the determined rate.

8. The method of claim 7, wherein determining the rate at which the set of memory cells respond to the sensing operation comprises calculating the subthreshold slope.

9. The method of claim 8, wherein the subthreshold slope is calculated based on a voltage difference between a first distribution of threshold values of the set employing a fourth sensing time and a second distribution of threshold values of the set employing a fifth sensing time, wherein the fifth sensing time is less than the fourth sensing time.

10. The method of claim 9, wherein the voltage difference is calculated based on a difference between a first verification level and a second verification level, wherein a number of cells in the second distribution above the second verification level is less than or equal to a number of cells in the first distribution above the first verification level.

11. The method of claim 5, wherein a first difference between the first sensing time and the second sensing time is equal to a second difference between the second sensing time and the third sensing time.

12. An apparatus, comprising:
a programming circuit configured to execute one or more program loops on a set of one or more memory cells;
a calculation circuit configured to calculate an activation response value for the set of one or more memory cells, wherein the activation response value is based on a rate at which the set of one or more memory cells respond to a voltage level; and
an alteration circuit configured to determine a sensing time for a subsequent program loop based on the calculated activation response value for the set,
wherein the calculation circuit is configured to calculate the activation response value based on a voltage difference between a first distribution of threshold values of the set employing a first sensing time and a second distribution of threshold values of the set employing a second sensing time, wherein the second sensing time is less than the first sensing time.

13. The apparatus of claim 12, wherein the voltage difference is calculated based on a difference between a first verification level and a second verification level, wherein a number of cells in the second distribution above the second verification level is less than or equal to a number of cells in the first distribution above the first verification level.

14. The apparatus of claim 12, wherein the alteration circuit is configured to alter the sensing time in response to a program condition.

15. The apparatus of claim 14, wherein the programming condition comprises a threshold voltage of a memory cell of the set satisfying a trigger threshold.

16. The apparatus of claim 14, wherein the programming condition comprises completion of a predetermined number of the program loops.

17. The apparatus of claim 14, wherein altering the sensing time comprises decreasing the sensing time during a first programming loop.

18. The apparatus of claim 13, wherein the second verification level is greater than the first verification level.

* * * * *